(12) United States Patent
Pattanayak et al.

(10) Patent No.: US 7,344,945 B1
(45) Date of Patent: Mar. 18, 2008

(54) METHOD OF MANUFACTURING A DRAIN SIDE GATE TRENCH METAL-OXIDE-SEMICONDUCTOR FIELD EFFECT TRANSISTOR

(75) Inventors: Deva Pattanayak, Cupertino, CA (US); Jason (Jianhai) Qi, San Jose, CA (US); Yuming Bai, Hayward, CA (US); Kam-Hong Lui, Santa Clara, CA (US); Ronald Wong, Millbrae, CA (US)

(73) Assignee: Vishay-Siliconix, Santa Clara, CA (US)

( * ) Notice: Subject to any disclaimer, the term of this patent is extended or adjusted under 35 U.S.C. 154(b) by 161 days.

(21) Appl. No.: 11/023,327

(22) Filed: Dec. 22, 2004

Related U.S. Application Data

(62) Division of application No. 10/846,339, filed on May 13, 2004, now Pat. No. 6,906,380.

(51) Int. Cl.
*H01L 21/336* (2006.01)

(52) U.S. Cl. ............... 438/270; 438/259; 438/589

(58) Field of Classification Search .............. None
See application file for complete search history.

(56) References Cited

U.S. PATENT DOCUMENTS

| | | | | |
|---|---|---|---|---|
| 5,326,711 A | * | 7/1994 | Malhi | 438/138 |
| 5,473,176 A | * | 12/1995 | Kakumoto | 257/192 |
| 5,648,283 A | * | 7/1997 | Tsang et al. | 438/138 |
| 5,742,076 A | * | 4/1998 | Sridevan et al. | 257/77 |
| 5,760,440 A | | 6/1998 | Kitamura et al. | 257/328 |
| 5,770,514 A | * | 6/1998 | Matsuda et al. | 438/589 |
| 5,998,833 A | | 12/1999 | Baliga | 257/329 |
| 6,319,777 B1 | | 11/2001 | Hueting et al. | 438/270 |
| 6,511,885 B2 | * | 1/2003 | Harada et al. | 438/270 |
| 6,649,975 B2 | | 11/2003 | Baliga | |
| 6,764,889 B2 | * | 7/2004 | Baliga | 438/197 |
| 6,797,588 B2 | * | 9/2004 | Ishikawa et al. | 438/426 |
| 6,838,730 B1 | | 1/2005 | Kawaguchi et al. | |
| 6,974,750 B2 | * | 12/2005 | Haase | 438/270 |
| 2001/0023959 A1 | | 9/2001 | Harada et al. | 257/328 |
| 2002/0125528 A1 | | 9/2002 | Kawaguchi et al. | |
| 2003/0001203 A1 | | 1/2003 | Ono et al. | |
| 2003/0006456 A1 | | 1/2003 | Takahashi et al. | |

FOREIGN PATENT DOCUMENTS

| DE | 102 39 310 | 3/2004 |
|---|---|---|
| EP | 1 170 803 | 1/2002 |

* cited by examiner

*Primary Examiner*—Zandra V. Smith
*Assistant Examiner*—Khanh Duong

(57) ABSTRACT

Embodiments of the present invention provide a striped or closed cell trench metal-oxide-semiconductor field effect transistor (TMOSFET). The striped or closed cell TMOSFET comprises a source region, a body region disposed above the source region, a drift region disposed above the body region, a drain region disposed above the drift region. A gate region is disposed above the source region and adjacent the body region. A gate insulator region electrically isolates the gate region from the source region, body region, drift region and drain region. The body region is electrically coupled to the source region.

16 Claims, 32 Drawing Sheets

METHOD OF MANUFACTURING A DRAIN SIDE GATE TRENCH METAL-OXIDE-SEMICONDUCTOR FIELD EFFECT TRANSISTOR

CROSS-REFERENCE TO RELATED APPLICATIONS

This is a divisional of application Ser. No. 10/846,339 filed May 13, 2004 now U.S. Pat. No. 6,906,380.

FIELD OF THE INVENTION

Embodiments of the present invention relate to metal-oxide-semiconductor field effect transistors (MOSFET), and more particularly to vertical MOSFET devices having a trench gate geometry.

BACKGROUND OF THE INVENTION

Referring to FIG. 1, a cross-sectional perspective view of a striped trench metal-oxide-semiconductor field effect transistor (TMOSFET) 100 according to the conventional art is shown. The striped TMOSFET 100 comprises a plurality of source contacts 110, a plurality of source regions 115, a plurality of gate regions 120, a plurality of gate insulator regions 125, a plurality of body regions 130, a drain region 135, 140 and drain contact 145. The drain region 135, 140 may optionally include a first drain portion 140 and a second drain portion 135.

The body regions 130 are disposed above the drain region 135, 140. The source regions 115, gate regions 120 and the gate insulator regions 125 are disposed within the body regions 130. The gate regions 120 and the gate insulator regions 125 are formed as parallel-elongated structures. The gate insulator region 125 surrounds the gate region 120. Thus, the gate regions 120 are electrically isolated from the surrounding regions by the gate insulator regions 125. The gate regions 120 are coupled to form a common gate of the device 100. The source regions 115 are formed as parallel-elongated structures along the periphery of the gate insulator regions 125. The source regions 115 are coupled to form a common source of the device 100, by the source contacts 110. Although shown as a plurality of individual source contacts 110, it is appreciated that the source contacts 110 may be implemented as a single conductive layer coupling all the source regions 115. The source contacts 110 also couple the source regions 115 to the body regions 130.

The source regions 115 and the drain region 140 are heavily n-doped (N+) semiconductor, such as silicon doped with phosphorous or arsenic. The body regions 130 are p-doped (P) semiconductor, such as silicon doped with boron. The gate regions 120 are heavily n-doped (N+) semiconductor, such as polysilicon doped with phosphorous. The gate insulator regions 125 may be an insulator, such as silicon dioxide.

When the potential of the gate regions 120, with respect to the source regions 115, is increased above the threshold voltage of the device 100, a conducting channel is induced in the body region 130 along the periphery of the gate insulator regions 125. The striped TMSOFET 100 will then conduct current between the drain region 140 and the source regions 115. Accordingly, the device 100 is in its on state.

When the potential of the gate regions 120 is reduced below the threshold voltage, the channel is no longer induced. As a result, a voltage potential applied between the drain region 140 and the source regions 115 will not cause current to flow there between. Accordingly, the device 100 is in its off state and the junction formed by the body region 130 and the drain region 140 supports the voltage applied across the source and drain.

If the drain region 135, 140 comprises a second drain portion 135 disposed above a first drain portion 140, the second portion of the drain region 135 is lightly n-doped (N−) semiconductor, such as silicon doped with phosphorous or arsenic, and the first portion of the drain region 140 is heavily n-doped (N+) semiconductor, such as silicon doped with phosphorous or arsenic. The lightly n-doped (N−) second portion of the drain region 135 results in a depletion region that extends into both the body regions 130 and the second portion of the drain region 135, thereby reducing the punch through effect. Accordingly, the lightly n-doped (N−) second portion of the drain region 135 acts to increase the breakdown voltage of the striped TMOSFET 100.

The channel width of the striped TMOSFET 100 is a function of the length of the plurality of the source regions 115. Thus, the striped TMOSFET 100 provides a large channel width to length ratio. Accordingly, the striped TMOSFET may advantageously be utilized for power MOSFET applications, such as switching elements in a pulse width modulation (PWM) voltage regulator.

Referring to FIG. 2, a cross-sectional perspective view of a closed cell trench metal-oxide-semiconductor field effect transistor (TMOSFET) 200 according to the conventional art is shown. The closed cell TMOSFET 200 comprises a plurality of source contacts 210, a plurality of source regions 215, a gate region 220, a gate insulator region 225, a plurality of body regions 230, a drain region 235, 240 and a drain contact 245. The drain region 235, 240 may optionally include a first drain portion 240 and a second drain portion 235.

The body regions 230, the source regions 215, the gate region 220 and the gate insulator region 225 are disposed above the drain region 235, 240. A first portion of the gate region 220 and the gate insulator region 225 is formed as substantially parallel-elongated structures 221. A second portion of the gate region 220 and the gate insulation region 225 is formed as substantially normal-to-parallel elongated structures 222. The first and second portions of the gate region 220 are all interconnected and form a plurality of cells. The body regions 230 are disposed within the plurality of cells formed by the gate region 220.

The gate insulator region 225 surrounds the gate region 220. Thus, the gate region 220 is electrically isolated from the surrounding regions by the gate insulator region 225. The source regions 215 are formed in the plurality of cells, along the periphery of the gate insulator region 225.

The source regions 215 are coupled to form a common source of the device 200, by the source contacts 210. Although shown as a plurality of individual source contacts 210, it is appreciated that the source contacts 210 may be implemented as a plurality of conductive strips each coupling a plurality of source regions 215, a single conductive layer coupling all the source regions 215, or the like. The source contacts 210 also couple the source regions 215 to the body regions 230.

The source regions 215 and the drain region 240 are heavily n-doped (+N) semiconductor, such as silicon doped with phosphorous or arsenic. The body regions 230 are p-doped (P) semiconductor, such as silicon doped with boron. The gate region 220 is heavily n-doped semiconductor (N+), such as polysilicon doped with phosphorous. The gate insulator region 225 may be an insulator, such as silicon dioxide.

When the potential of the gate region 220, with respect to the source regions 215, is increased above the threshold voltage of the device 200, a conducting channel is induced in the body region 230 along the periphery of the gate insulator region 225. The device 200 will then conduct current between the drain region 240 and the source regions 215. Accordingly, the device 200 is in its on state.

When the potential of the gate region 220 is reduced below the threshold voltage, the channel is no longer induced. As a result, a voltage potential applied between the drain region 240 and the source regions 215 will not cause current to flow there between. Accordingly, the device is in its off state and the junction formed by the body region 230 and the drain region 240 supports the voltage applied across the source and drain.

If the drain region 235, 240 comprises a second portion 235 disposed above a first portion 240, the second portion of the drain region 235 is lightly n-doped (N−) semiconductor, such as silicon doped with phosphorous or arsenic, and the first portion of the drain region 240 is heavily n-doped (N+) semiconductor, such as silicon doped with phosphorous. The lightly n-doped (N−) second portion of the drain region 235 results in a depletion region that extends into both the body regions 230 and the second portion of the drain region 235, thereby reducing the punch through effect. Accordingly, the lightly n-doped (N−) second portion of the drain region 235 acts to increase the breakdown voltage of the closed cell TMOSFET 200.

The channel width of the closed cell TMOSFET 200 is a function of the sum of the width of the source regions 215. Thus, the closed cell TMOSFET 200 geometry advantageously increases the width of the channel region, as compared to the striped TMOSFET 100. Accordingly, the closed cell TMSOFET 200 has a relatively low channel resistance (e.g., on resistance), as compared to the striped TMOSFET 100 geometry. The low channel resistance reduces power dissipated in the closed cell TMOSFET 200, as compared to the striped TMOSFET 100.

Similarly, the gate-to-drain capacitance of the closed cell TMOSFET 220 is a function of the area of overlap between the bottom of the gate region 220 and the drain region 240. Accordingly, the closed cell TMOSFET 200 geometry suffers from a higher gate-to-drain capacitance, as compared to the striped TMOSFET 100. The relatively high gate to drain capacitance limits the switching speed of the closed cell TMOSFET 200, as compared to the striped TMOSFET 100.

SUMMARY OF THE INVENTION

Accordingly, embodiments of the present invention provide a trench metal-oxide-semiconductor field effect transistor (TMOSFET) having its gate and drain regions on the same side while the source region is oppositely disposed. Embodiments of the present invention provide a striped or closed cell TMOSFET having an on resistance substantially equivalent to a striped or closed cell TMOSFET. Further, embodiments of the present invention provide a striped or closed cell TMOSFET having a low gate-to-drain capacitance.

Embodiments of the present invention provide a striped or closed cell TMOSFET comprising a source region, a body region disposed above the source region, a drift region disposed above the body region, a drain region disposed above the drift region. A gate region is disposed above the source region and adjacent to the body region. A gate insulator region electrically isolates the gate region from the source region, body region, drift region and drain region. The body region is electrically coupled to the source region.

Embodiments of the present invention also provide a method of fabricating a striped or closed cell TMOSFET. The method of fabrication comprises growing a p-doped epitaxial silicon layer on an n-doped silicon substrate, and growing an n-doped epitaxial silicon layer upon the p-doped silicon layer. The epitaxial deposited silicon layers and a portion of the substrate are selectively etched to form a set of trenches. The silicon proximate the trenches is oxidized to form a gate oxide region. A first portion of the trenches are filed with a polysilicon and the remaining portion of the trenches are filled with a dielectric. N-type impurities are implanted to form drift regions and drain regions. P-type impurity is implanted to form the body region of the N-channel MOSFET.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
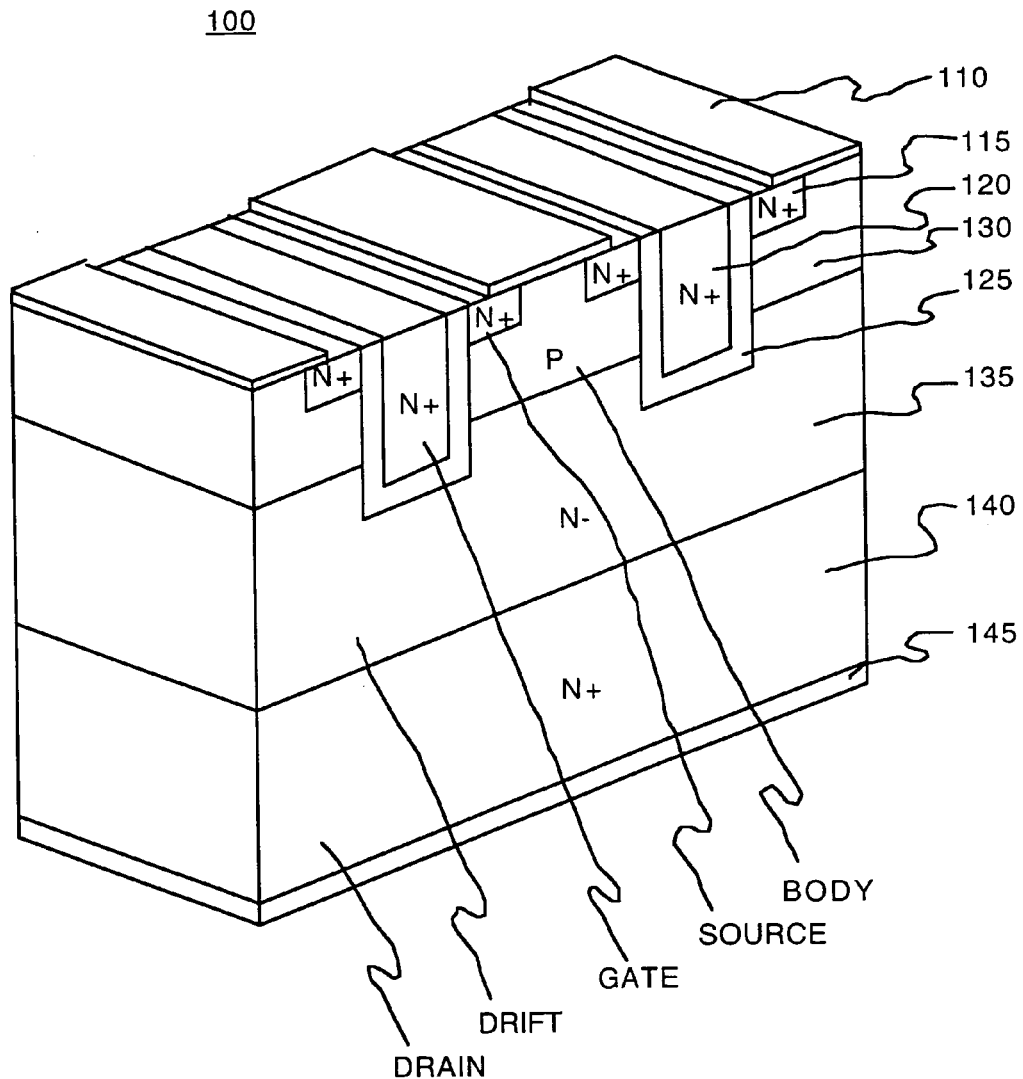
FIG. 1 shows a cross-sectional perspective view of a striped trench metal-oxide-semiconductor field effect transistor (TMOSFET) according to the conventional art.
Figure 2:
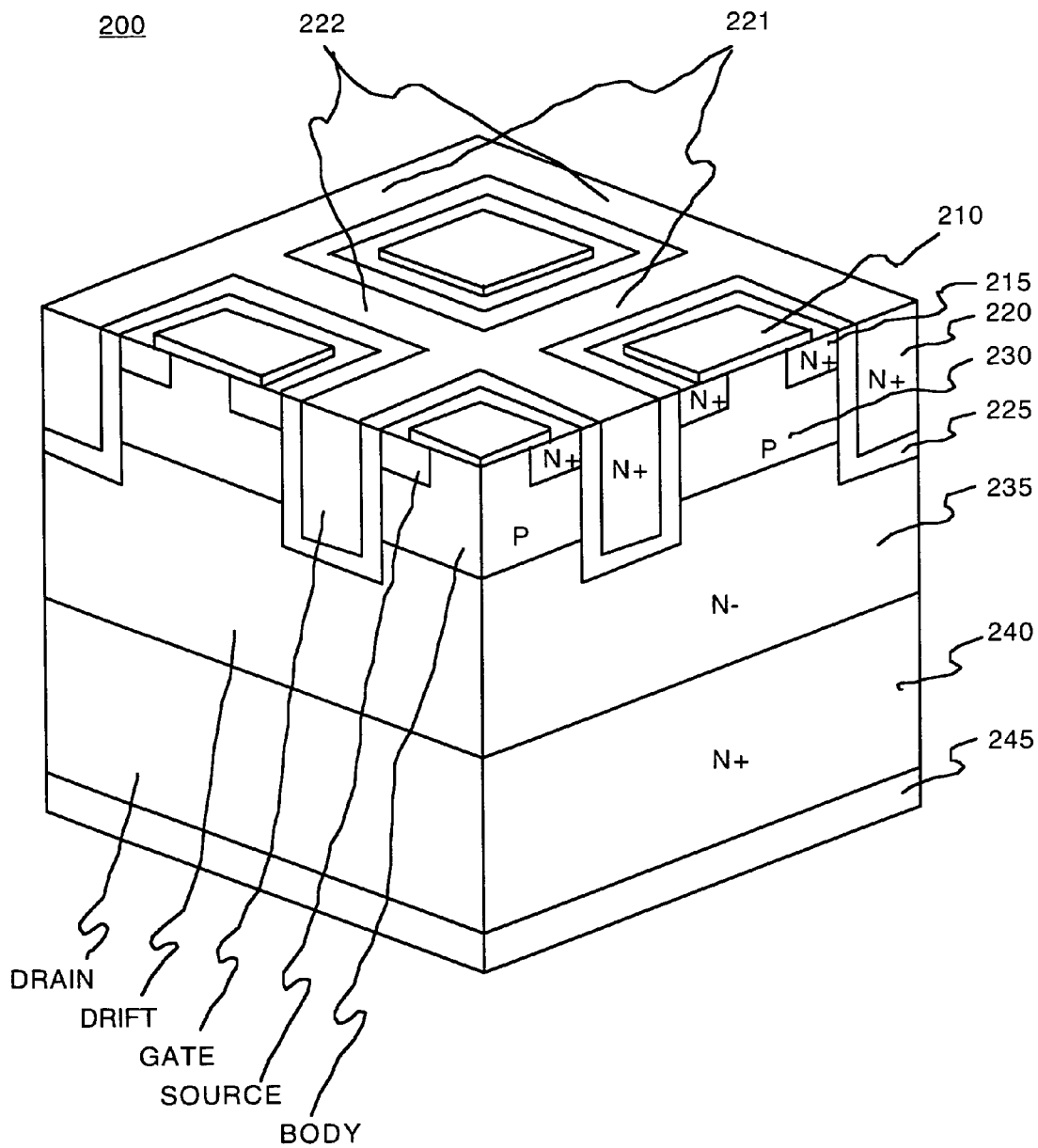
FIG. 2 shows a cross-sectional perspective view of a closed cell trench metal-oxide-semiconductor field effect transistor (TMOSFET) according to the conventional art.
Figure 3:
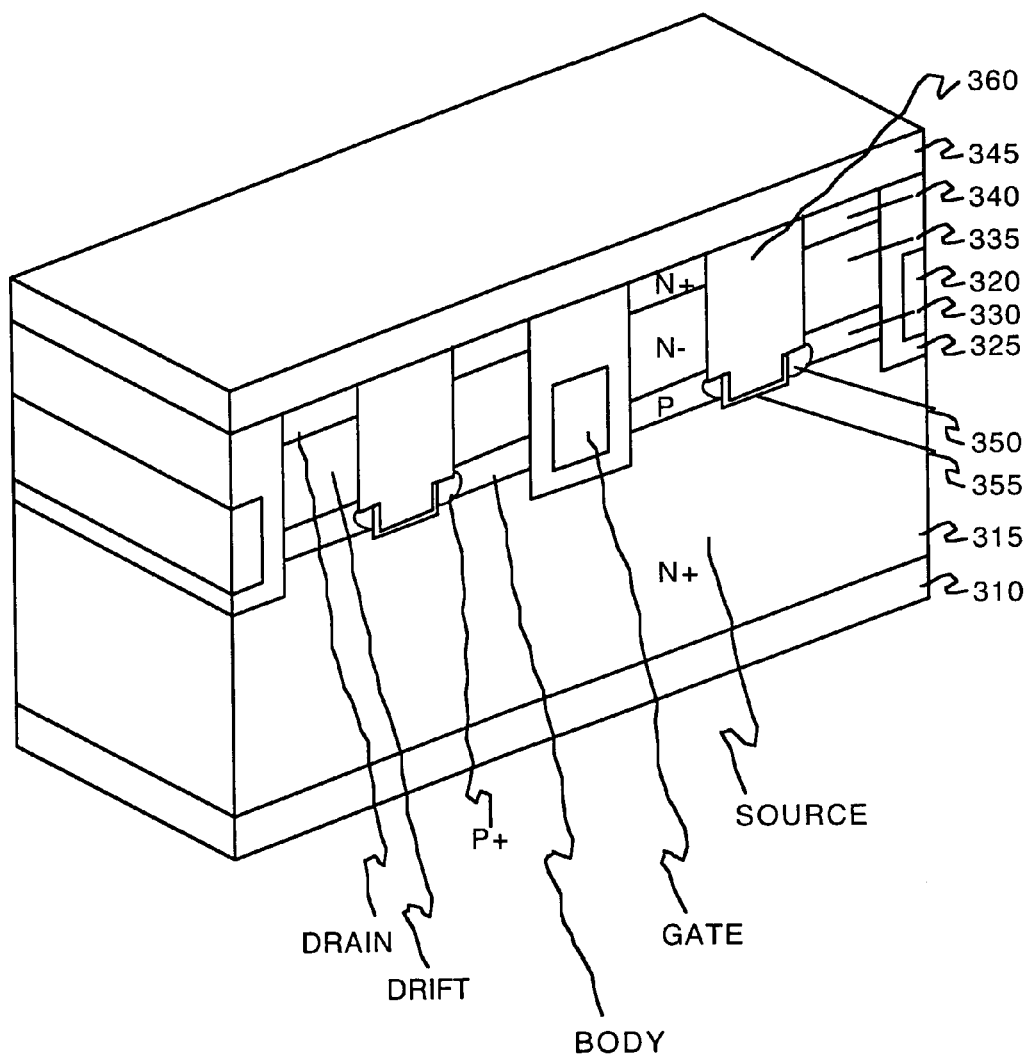
FIG. 3 shows a cross-sectional perspective view of a striped cell trench metal-oxide-semiconductor field effect transistor (TMOSFET), in accordance with one embodiment of the present invention.

Referring now to FIG. 3, a cross-sectional perspective view of a striped cell trench metal-oxide-semiconductor field effect transistor (TMOSFET) 300, in accordance with one embodiment of the present invention, is shown. The striped cell TMOSFET 300 comprises a source contact 310, a source region 315, a plurality of gate regions 320, a plurality of gate insulator regions 325, a plurality of body regions 330, a plurality of drift regions 335, a plurality of drain regions 340 and a drain contact 345. The striped cell TMOSFET 300 may further comprise a first source-body contact region 350, a second source-body contact region 355, and a source-body contact insulator region 360.

The plurality of gate regions 320, the plurality of gate insulator regions 325, the plurality of body regions 330, the plurality of drift regions 335 and the plurality of drain regions 340 are disposed above the source region 315. The gate regions 320 and the gate insulator regions 325 are formed as substantially parallel elongated structures. The body regions 330 are disposed above the source region 315 and between the parallel elongated structures formed by the gate regions 320 and gate insulator regions 325. The drift regions 335 are disposed above the body regions 330 and between the parallel elongated structures formed by the gate regions 320 and gate insulator regions 325. The drain regions 340 are disposed above the drift regions 335 and between the parallel elongated structures formed by the gate regions 320 and gate insulator regions 325.

The gate regions 320 are surrounded by corresponding gate insulator regions 325. Thus, the gate regions 320 are electrically isolated from the surrounding regions (e.g., source region 315, body regions 330, drift regions 335, drain regions 340 and drain contact 345) by the gate insulator regions 325. Although not shown, the gate regions 320 are interconnected to each other (e.g., in the periphery region of the device by a gate contact). The plurality of drain regions 340 are coupled to form a common drain of the device by the drain contact 345. From the above description, it is appreciated that the present striped TMOSFET 300 has its gate regions 320 and drain regions 340 substantially on the same side.

In one implementation, the source region 315 and the drain regions 340 may be heavily n-doped (N+) semiconductor, such as silicon doped with phosphorous or arsenic. The body regions 330 may be p-doped (P) semiconductor, such as silicon doped with boron. The drift regions may be lightly n-doped (N−) semiconductor, such as silicon doped with phosphorous or arsenic. The gate regions 320 may be heavily n-doped (N+) or p-doped (P+) semiconductor, such as polysilicon doped with phosphorous or arsenic, or polysilicon doped with boron. The gate insulator region 325 may be an oxide, such as silicon dioxide.

In another implementation, the source region 315 and the drain regions 340 may be heavily p-doped (P+) semiconductor, such as silicon doped with boron. The body regions 330 may be lightly n-doped (N−) semiconductor, such as silicon doped with phosphorous or arsenic. The drift regions may be lightly p-doped (P−) semiconductor, such as silicon doped with boron. The gate regions 320 may be heavily n-doped (N+) or p-doped (P+) semiconductor, such as polysilicon doped with phosphorous or arsenic of polysilicon doped with boron. The gate insulator region 325 may be an oxide, such as silicon dioxide.

The body regions 330 are electrically coupled to the source region 315. In one implementation, the body regions 330 are coupled to the source region 315 by the first and second source-body contact regions 350, 355. The second source-body contact regions 355 are a silicide, such as tungsten silicide. The first source-body contact regions 350 are heavily p-doped (P+) semiconductor, such as silicon doped with boron. The source-body contact regions 350, 355 are electrically isolated from the surrounding regions (e.g., drift regions 335) by the source-body contact insulator region 360. In one implementation, the source-body contact insulator region 360 may be an oxide, such as silicon dioxide or the like. In another implementation, the source-body contact insulator region 360 may be p-doped polysilicon, silicon nitride or the like.

When the potential of the gate regions 320, with respect to the source region 315, is increased above the threshold voltage of the device 300, a conducting channel is induced in the body regions 330 along the periphery of the gate insulator regions 325. The device 300 will then conduct current between the plurality of drain regions 340 and the source region 315. Accordingly, the device 300 is in its on state. When the potential of the plurality of gate regions 320 is reduced below the threshold voltage, the channel is no longer induced. As a result, a voltage potential applied between the plurality of drain regions 340 and the source region 315 will not cause current to be conducted there between. Accordingly, the device 300 is in its off state and the junction of the body region 330 and the drift region 335 supports the voltage applied across the source region 315 and the drain regions 340

The width of the channel is a function of the sum of the lengths of the drain regions 340. Hence, the width of the channel region is substantially equal to the legacy striped cell TMOSFET 100. Therefore, the on resistance (Rds-on) of the device 300 is substantially equal to the legacy striped cell TMOSFET 100.

In the legacy striped cell TMOSFET, a lead wire is utilized to connect the source on the die to an external device. The source wire lead increases the effective inductance of the source in the legacy stripped cell TMSOFET 100. The source of the present striped cell TMOSFET 300 may be connected directly to a PCB or a legacy striped cell TMOSFET (e.g., source contact covers the bottom of the die and may be wave soldered to a PCB or the like). The wire lead of the source may be eliminated, and therefore the effective source inductance is reduced.

The present striped cell TMOSFET 300 may be fabricated such that the gate regions 320 do not overlap the drain regions 340. Therefore the separation of the gate regions 320 and drain regions 340 is increased. Accordingly, the gate-to-drain capacitance (Cgd) may be substantially reduced as compared to the legacy striped cell TMOSFET 100. For example, in one implementation the gate regions substantially overlap the body regions and do not substantially overlap the drift regions or the drain regions.

In addition, the present striped cell TMOSFET 300 has a relatively large gate-to-source capacitance (Cgs) as a result of the overlap of the gate regions 320 with the source region 315. Therefore, the gate-to-source capacitance (Cgs) of the present striped cell TMOSFET 300 is generally greater than the gate-to-source capacitance (Cgs) of the legacy striped cell TMOSFET 100. Hence, the ratio of the gate-to-drain capacitance (Cgd) to the source-to-drain capacitance (Cgs), a figure of merit, of the present stripe cell TMOSFET 300 is less (e.g., better figure of merit) than the legacy striped cell TMOSFET 100. It is also appreciated that the ratio of the gate-to-drain capacitance (Cgd) to gate-to-source capacitance (Cgs) may be adjusted by adjusting the thickness of the portion of the gate oxide regions 325 proximate the source region 315 and/or the portion of the gate insulator regions 325 proximate the drain regions 340.

Overlap between the gate regions 320 and the drift regions 335 cause an increase in accumulation in the conduction channel during the on state of the device 300. Hence, if the gate regions 320 extend to overlap the body regions 330 and the drift regions 335, the on resistance (Rds-on) of the present striped cell TMOSFET 300 may be further reduced.

Figure 4:
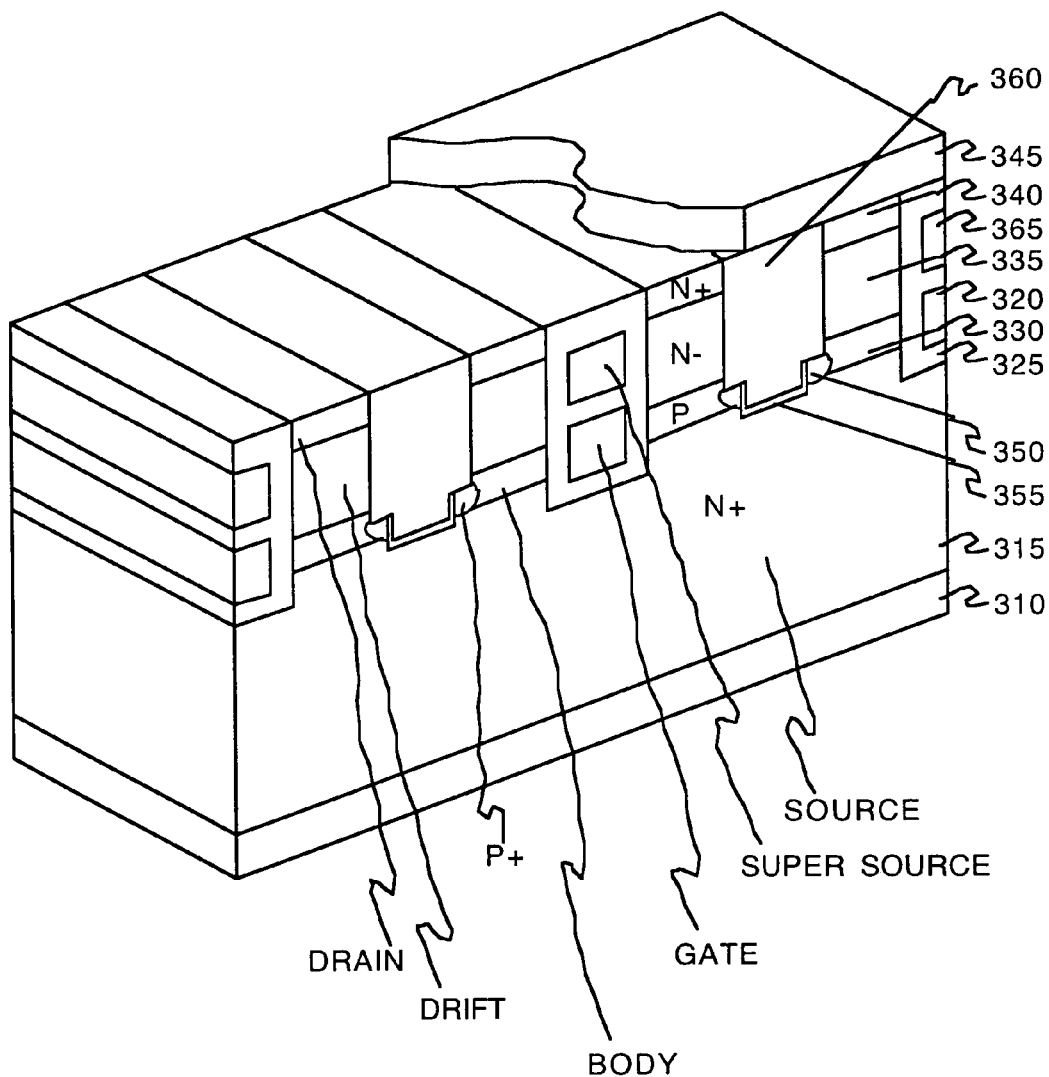
FIG. 4 shows a cross-sectional perspective view of another striped cell trench metal-oxide-semiconductor field effect transistor (TMOSFET), in accordance with one embodiment of the present invention.

Referring now to FIG. 4, a cross-sectional perspective view of another striped cell trench metal-oxide-semiconductor field effect transistor (TMOSFET) 400, in accordance with one embodiment of the present invention, is shown. The striped cell TMOSFET 400 is the same as described with reference to FIG. 3, with the addition of a plurality of super source regions 365. The super source regions 365 are formed as substantially parallel elongated structures disposed above the gate regions 320. The gate insulator regions also surround the super source regions 365 and electrically isolate the super source regions 365 from the surrounding regions (e.g., gate regions 320, body regions 330, drift regions 335, drain regions 340 and drain contact 345).

Although not shown, the super source regions 365 are electrically coupled to the source region 315 (e.g., by a contact in the periphery region). The super source regions 365 are adapted to decrease the on state resistance (Rds-on) and to increase the breakdown voltage in the off state.

The drain contact 345 is also shown substantially cutaway to reveal the striped cell structure in greater detail. However, it is understood that the drain contact 345 overlays the surface of the core region of the present striped cell TMOSET 400.

Figure 5A:
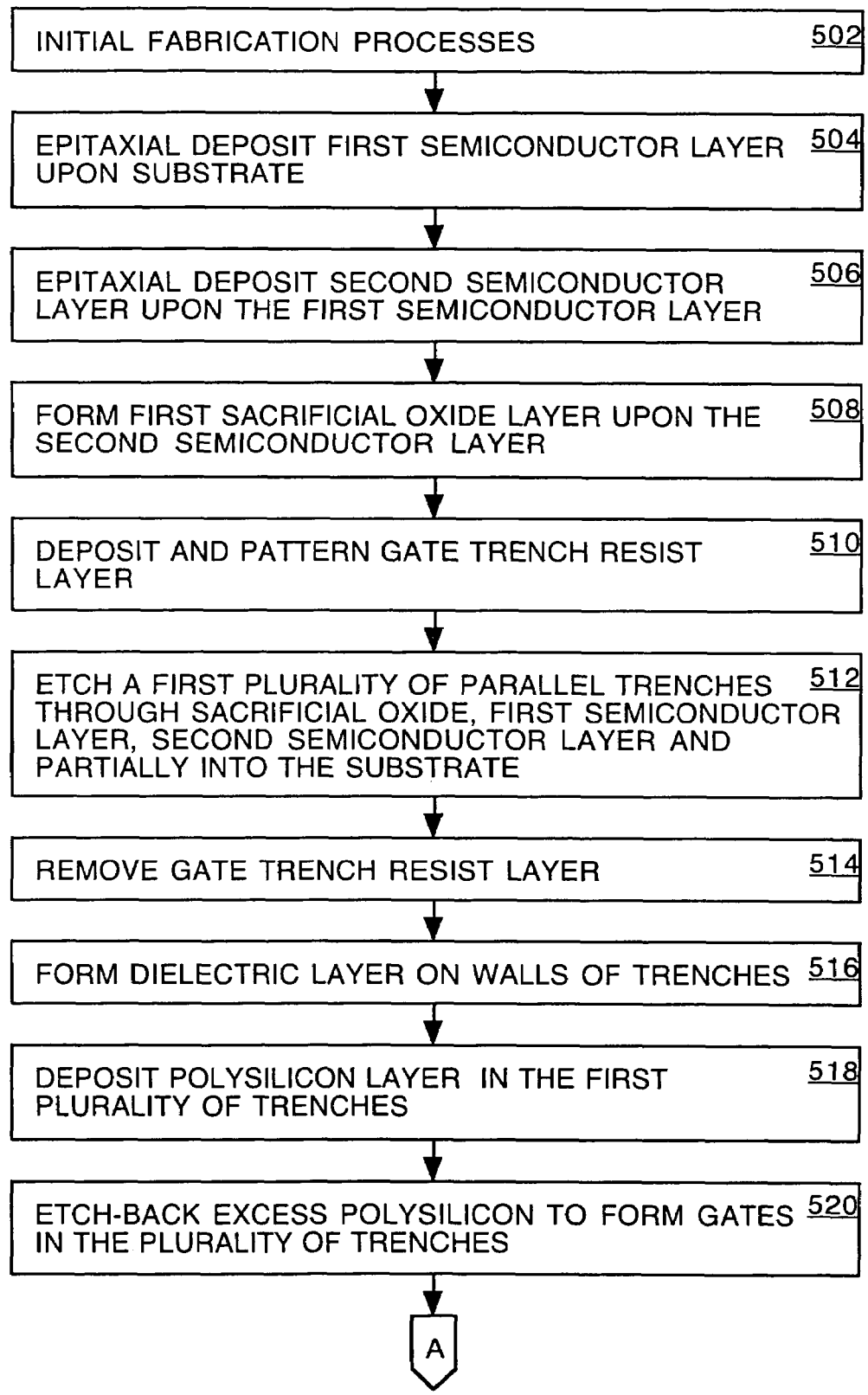
FIGS. 5A-5D show a flow diagram of a method of fabricating a striped cell trench metal-oxide-semiconductor field effect transistor (TMOSFET), in accordance with one embodiment of the present invention.

Referring now to FIGS. 5A-5D, a flow diagram of a method of fabricating a striped cell trench metal-oxide-semiconductor field effect transistor (TMOSFET), in accordance with one embodiment of the present invention, is shown. The method of fabricating the striped cell TMOSFET, in accordance with one embodiment of the present invention, is illustrated in FIGS. 6A-6O. As depicted in FIGS. 5A and 6A, the process begins, at 502, with various initial processes upon a substrate 502', such as cleaning, depositing, doping, etching and/or the like. In one implementation, the substrate 502' comprises silicon heavily doped with phosphorous (N+). It is appreciated that the semiconductor substrate 502' will substantially comprise a source region of the TMOSFET upon completion of the fabrication process.

At 504, a first semiconductor layer 504' is epitaxial deposited upon the substrate 502'. In one implementation, the first semiconductor layer 504' comprises p-doped (P) silicon. The epitaxial deposited silicon may be doped by introducing the desired impurity, such as boron, into the epitaxal reaction chamber. Alternatively, the doping of the first semiconductor layer 504' may be achieved by a high-energy implantation with a p-type dopant, such as boron.

At 506, a second semiconductor layer 506' is epitaxial deposited upon the first semiconductor layer 504'. In one implementation, the second semiconductor layer 506' comprises lightly p-doped (P−) silicon. The epitaxial deposited silicon may be doped by introducing the desired impurity, such as boron, into the reaction chamber. Alternatively, the doping of the second semiconductor layer 506' may be achieved by a high-energy implantation with a p-type dopant, such as boron.

At optional process 508, a sacrificial oxide layer 508' is formed upon the second semiconductor layer 506'. In one implementation, the sacrificial oxide 508' is formed by oxidizing the surface of the second semiconductor layer 506'. At 510, a photo-resist is deposited and patterned by any well-know lithography process to form a gate trench resist layer 510'.

At 512, the exposed portions of the sacrificial oxide layer 508', the second semiconductor layer 506', the first semiconductor layer 504' and a portion of the substrate 502' are etched by any well-known anisotropic etching method (e.g., dry etch). In one implementation, an ionic etchant interacts with the sacrificial oxide layer 508', second semiconductor layer 506', first semiconductor layer 504' and the substrate 502' exposed by the gate trench resist layer 510'. The etching process results in a first plurality of trenches 512' formed as substantially parallel structures.

At 514, the gate trench resist layer 510' is removed utilizing an appropriate resist stripper or a resist ashing process. At 516, a dielectric layer 516' is formed on the walls of the first plurality of trenches 512'. In one implementation, the dielectric layer 516' is formed by oxidizing the exposed surface of the silicon to form a silicon dioxide layer. The resulting dielectric layer 516' along the trench walls forms a first portion of the gate insulator regions.

At 518, a polysilicon layer is deposited in the first plurality of trenches 512'. In one implementation, the polysilicon is deposited in the trenches 512' by a method such as decomposition of silane ($SiH_4$). The polysilicon is doped with n-type impurity such as phosphorous or arsenic. The polysilicon may be doped by introducing the impurity during the deposition process. At 520, an etch-back process is performed to remove excess polysilicon material to form the gate regions 520'. The polysilicon layer is etched back such that the desired separation/overlap between the gate region formed from the polysilicon layer in the trench and the subsequently formed body, drift and drain regions. In one implementation, the excess polysilicon is removed by a combination of a chemical mechanical polishing (CMP) process and an anisotropic etching method.

In an optional embodiment, a dielectric layer is formed over the gate regions 520'. In one implementation, the polysilicon of the gate regions 512' is oxidized to form a silicon dioxide layer. A second polysilicon layer is deposited over the dielectric layer formed upon the gate regions 520'. Another etch back process is utilizes to form super source regions from the second polysilicon layer.

Figure 5B:
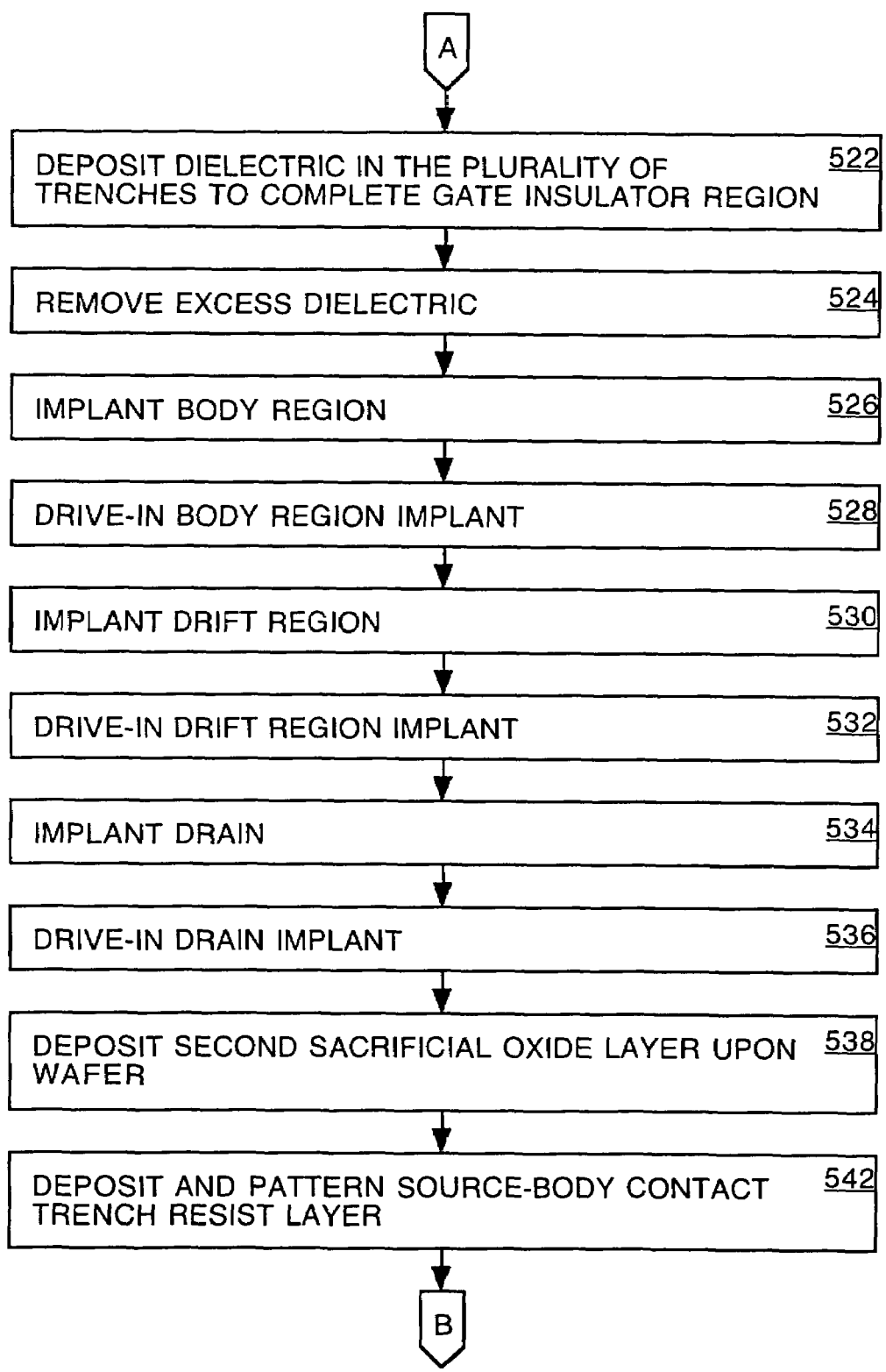
Figure 6A:
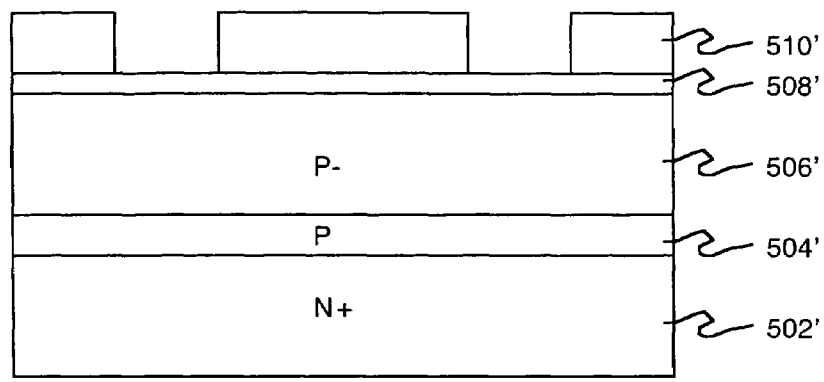
FIGS. 6A-6O show a cross-sectional plane view of various phases of fabricating a striped cell trench metal-oxide-semiconductor field effect transistor (TMOSFET), in accordance with one embodiment of the present invention.
Figure 6B:
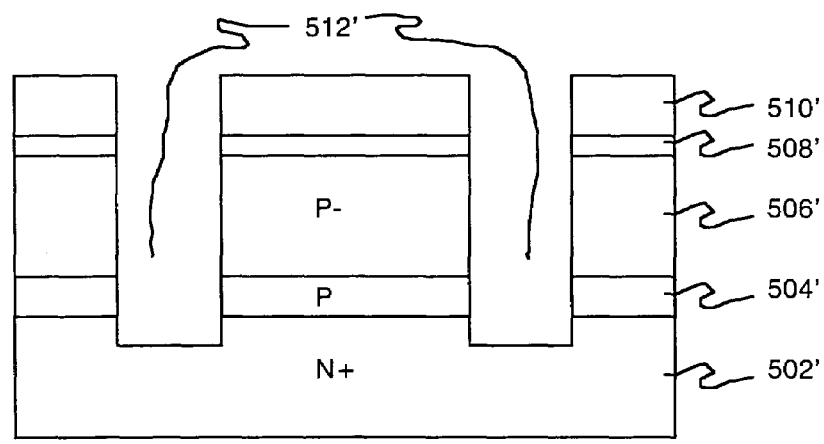
Figure 6C:
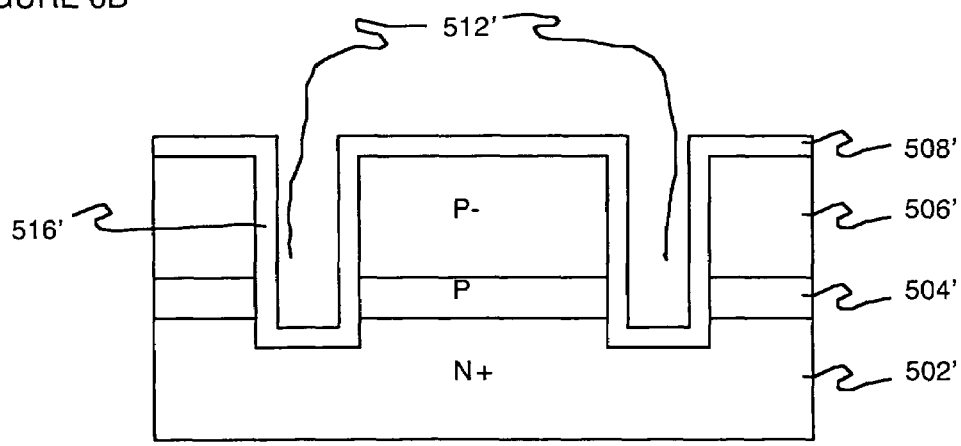
Figure 6D:
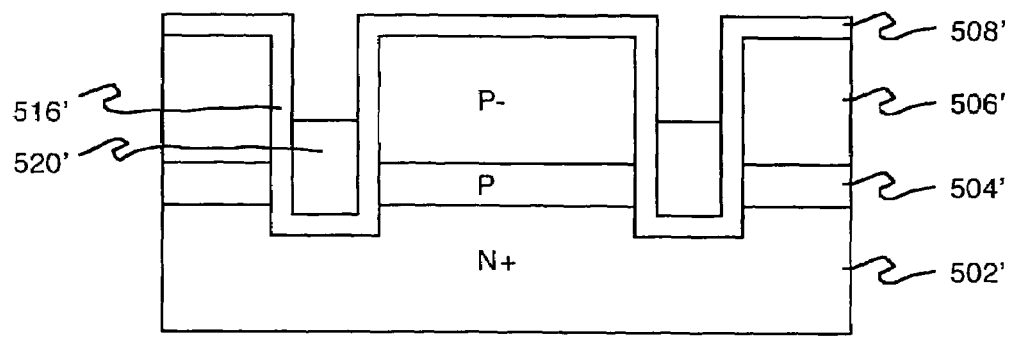
Figure 6E:
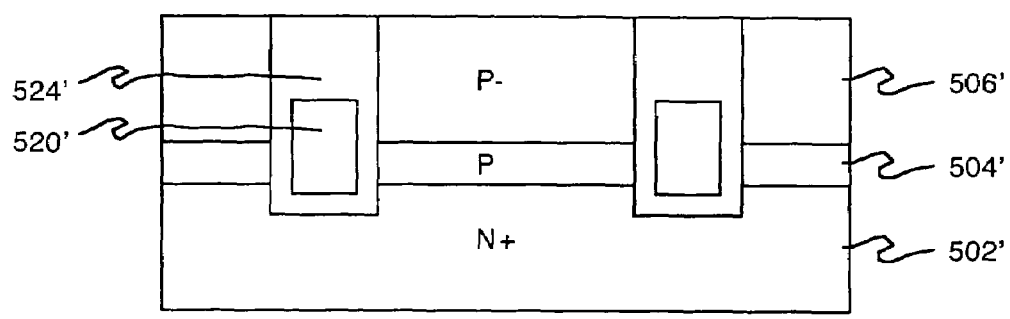
Figure 6F:
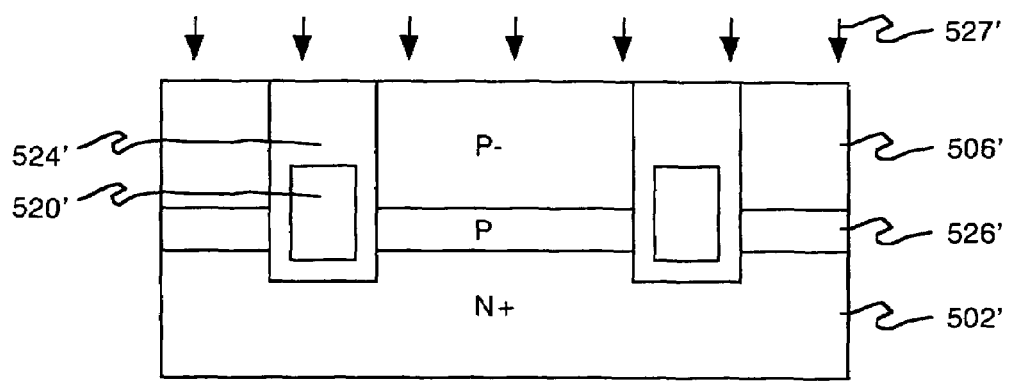
Figure 6G:
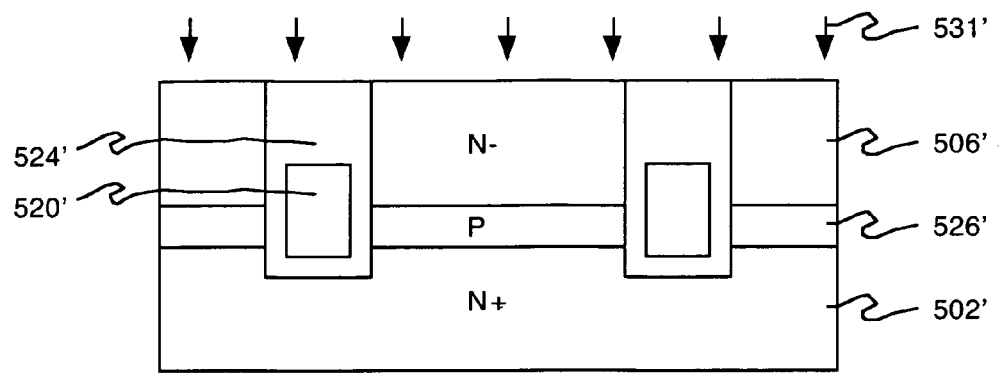
Figure 6H:
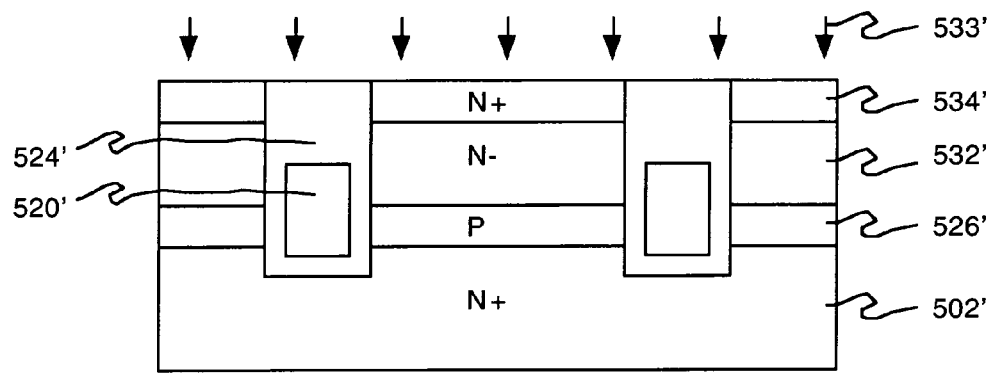
Figure 6I:
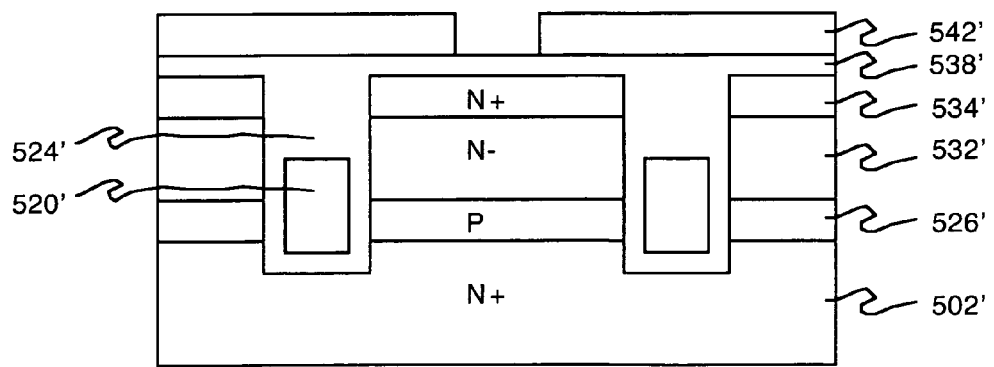

As depicted in FIGS. 5B and 6E, a dielectric layer is deposited in the first plurality of trenches 512', at 522. In one implementation, the dielectric is deposited in the trenches by a method such as decomposition of tetraethlorthosilicate (TEOS) or high density plasma fill (HDP). At 524, excess dielectric material is removed to complete the gate insulator regions 524'. In one implementation, the excess dielectric is removed by a chemical mechanical polishing (CMP) process.

At 526, the first semiconductor layer 504' is p-doped to adjust the doping concentration to form body regions 526' between the first plurality of trenches 512'. In one implementation, the doping process implants a p-type impurity 527', such as boron, in the first semiconductor layer 504'. At 528, a thermal cycle is utilized to drive (e.g., diffusion) the implanted impurity substantially through the depth of the first semiconductor layer 504', thereby forming the body regions 526'. At 530, the second semiconductor layer 506' is n-doped. In one implementation, the doping process implants an n-type impurity 531', such as phosphorous or arsenic, in the second semiconductor layer 506'. At 532, a second thermal cycle is utilized to drive (e.g., diffusion) the implanted impurity substantially through the depth of the second semiconductor layer 506'. At 534, the upper portion of the second semiconductor layer 506' is heavily n-doped to form the drains 534' in the upper portion and the drift regions 530' in the lower portion of the second semiconductor layer 506' between the first plurality of trenches 512'. In one implementation, the doping process implants an n-type impurity 533', such as phosphorous or arsenic, in the upper portion of the second semiconductor layer 506'. At 536, a third thermal cycle may be utilized to drive the third implant to achieve the desired depth of the drain regions 534'.

At optional process 538, a second sacrificial oxide layer 538' is formed upon the wafer. In one implementation, the sacrificial oxide layer 538' is formed by oxidizing the surface of the wafer. At 542, a photo-resist is deposited and patterned by any well-know lithography process to form a source-body contact trench resist layer 542'.

Figure 5C:
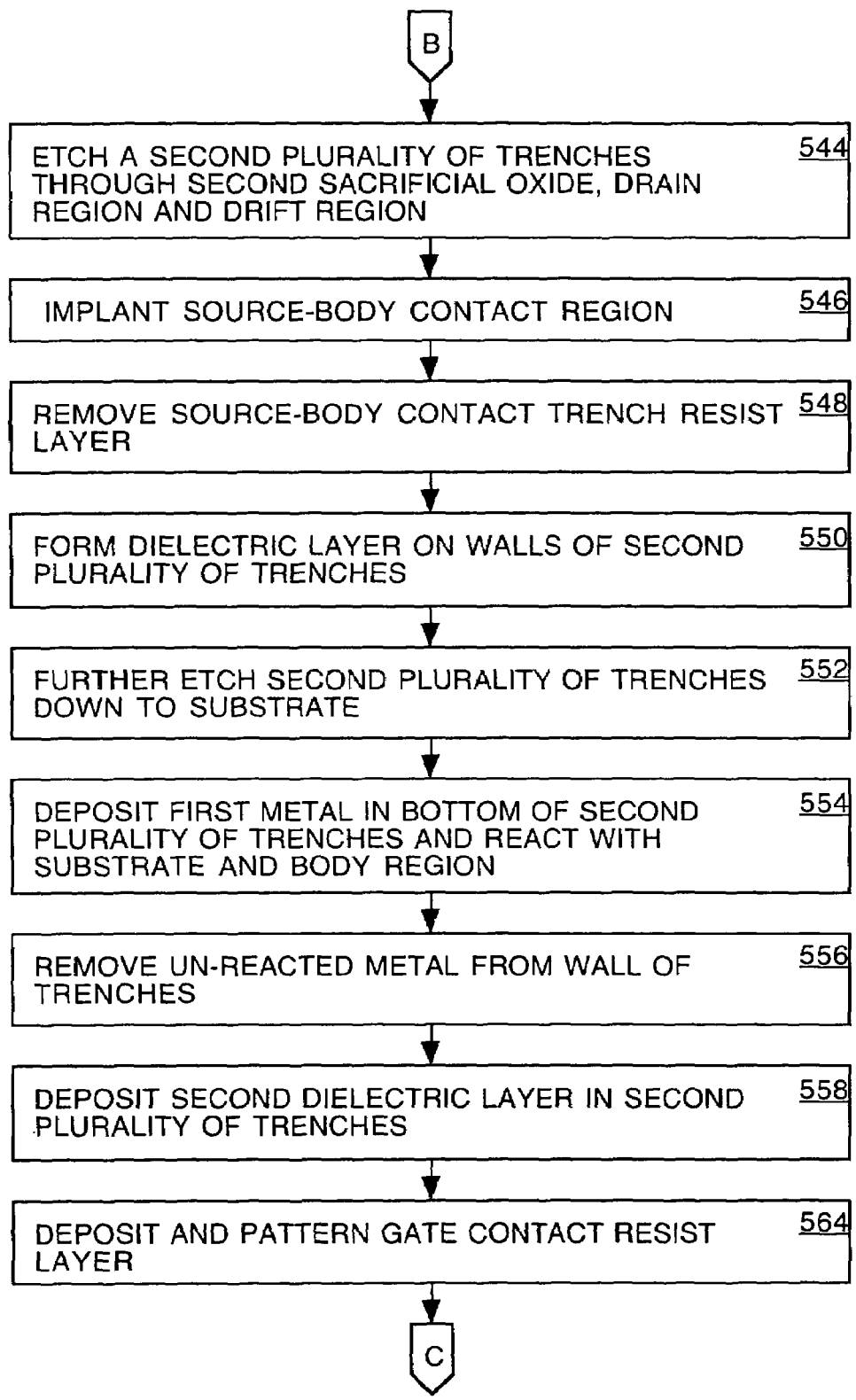
Figure 5D:
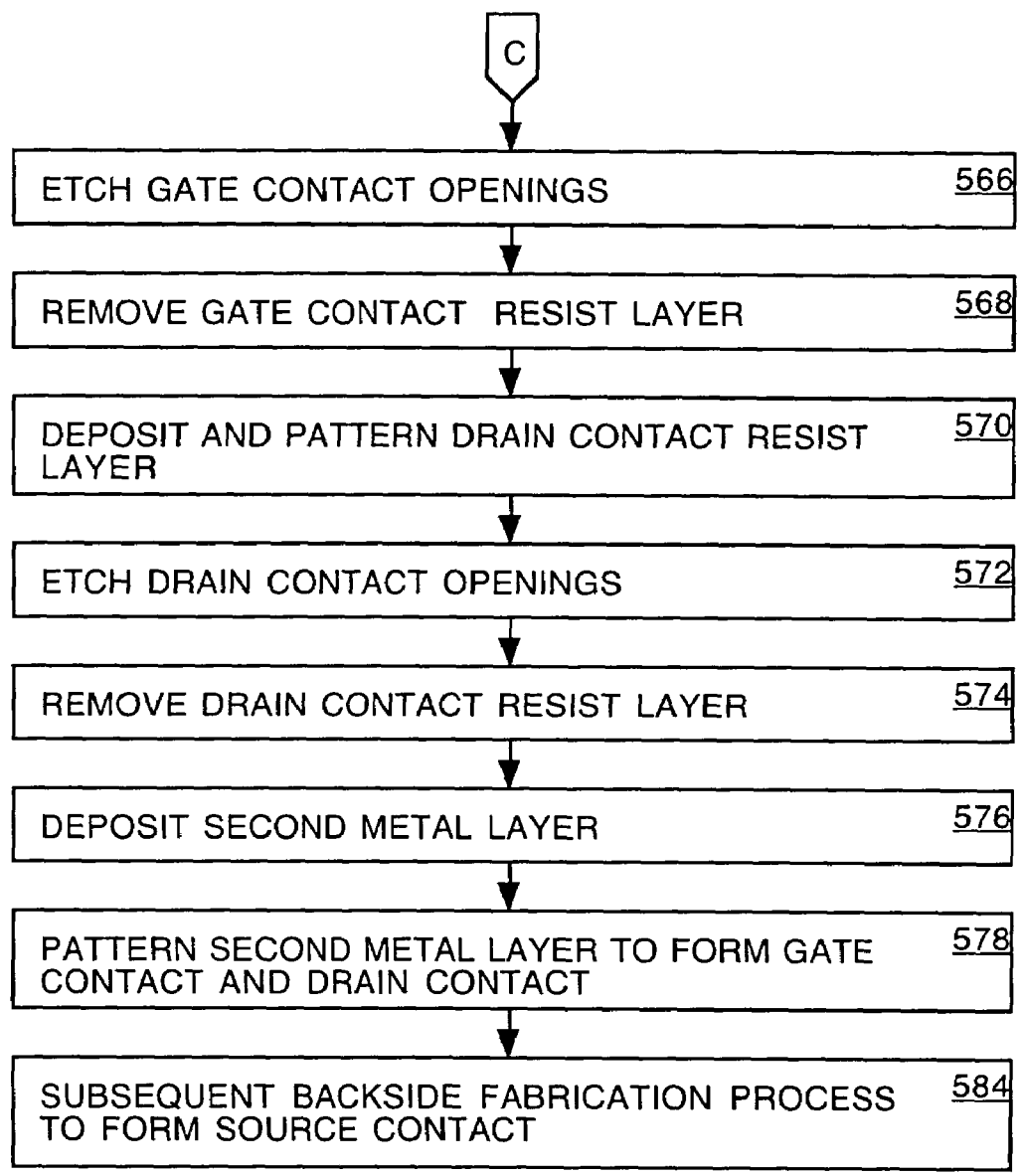
Figure 6J:
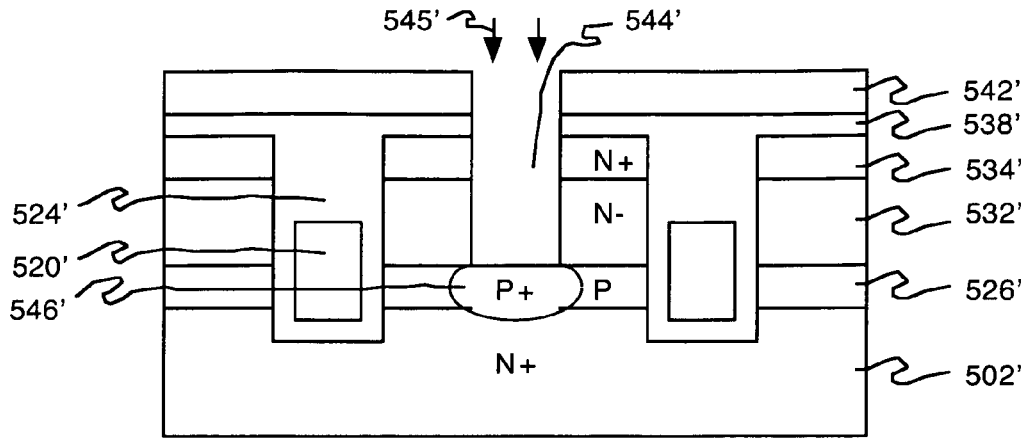
Figure 6K:
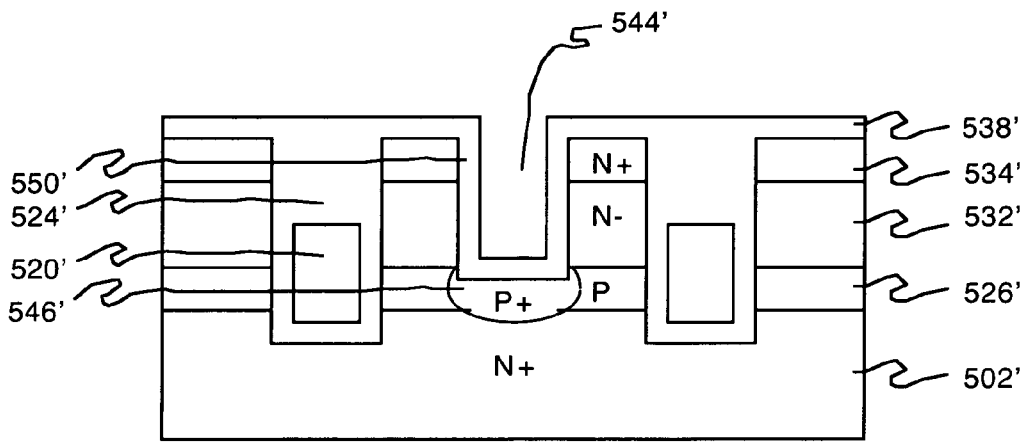
Figure 6L:
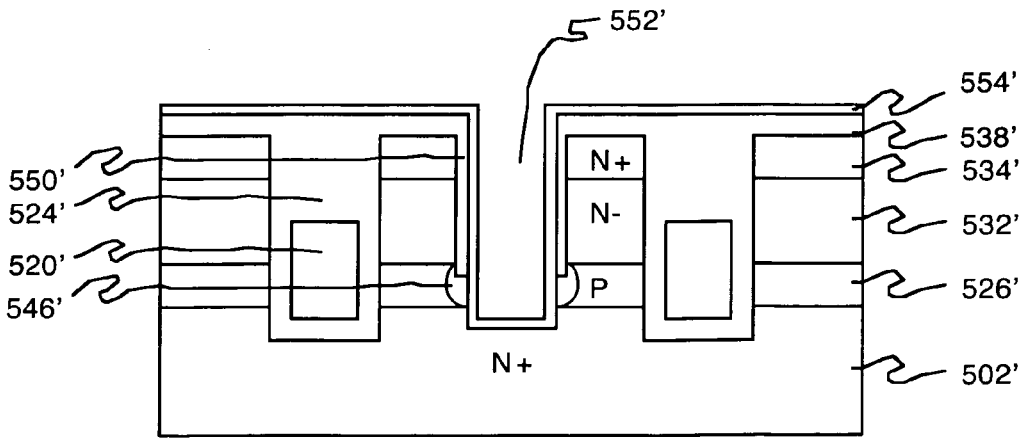
Figure 6M:
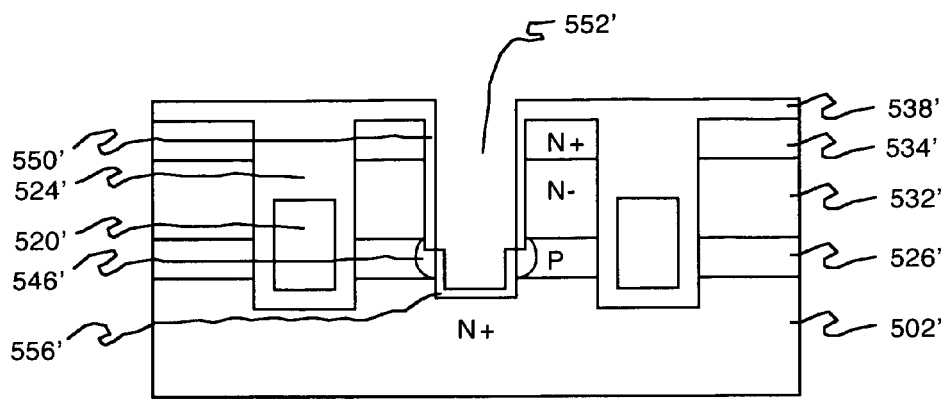
Figure 6N:
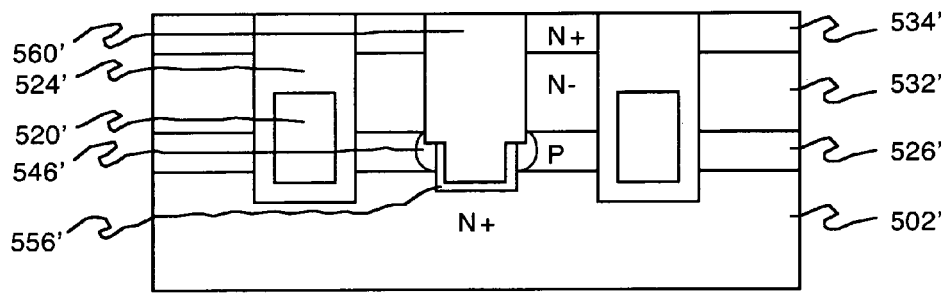
Figure 6O:
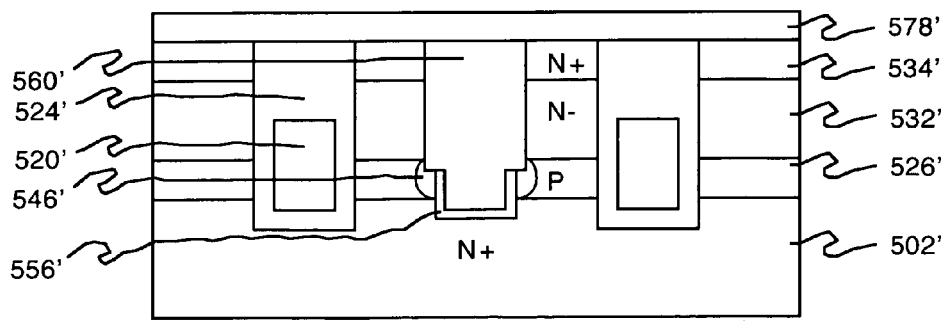

As depicted in FIGS. 5C and 6J, the exposed portions of the second sacrificial oxide layer 538', the drain regions 534' and the drift regions 530' are etched by any well-known anisotropic etching method, at 544. In one implementation, an ionic etchant interacts with sacrificial oxide layer 538' the drain regions 534' and the drift regions 530' exposed by the source-body contact trench resist layer 542'. The etching process forms a second plurality of substantially parallel trenches 544'. Each of the second plurality of trenches 544' is disposed between each of the first plurality of trenches 512'.

At 546, the exposed portion of the body regions 526' are heavily p-doped to form first source-body contacts 546'. In one implementation, the doping process implants a p-type impurity 545', such as boron, in the body regions 526'. A thermal cycle may be utilized to drive the source-body implant substantially throughout the exposed portions of the body regions 526'. It is appreciated that a portion of the implant will diffuse laterally into the adjacent un-exposed portion of the body regions 526'.

At 548, the source-body contact trench resist layer 542' is removed utilizing an appropriate resist stripper or a resist ashing process. At 550, a dielectric layer 550' is formed on the walls of the second plurality of trenches 544'. In one implementation, the dielectric layer 550' is formed by oxidizing the exposed surface of the silicon to form a silicon dioxide layer.

At 552, the dielectric formed at the bottom of the second plurality of trenches 544' and the exposed portions of the body regions 526' are etched by any well-known anisotropic etching method. The etching process is performed until the second plurality of trenches 552' extend partially into the source region 502' (e.g. substrate). The etching process leaves the adjacent portions of the body regions 526' and source region 502' exposed, while the drift regions 530' and the drain regions remain protected by the dielectric layer 550' along the sidewalls. It is appreciated that the portions of the source-body contact implant that diffused laterally into the un-exposed portions of the body regions 526' substantially remains after the present etching process. The remaining portions of the source-body contact implant form first source-body contacts.

At 554, a first metal layer 554' is deposited in the bottoms of the second plurality of trenches 552' and reacted with the source region 502' and body regions 526'. In one implementation, titanium is sputtered and rapidly thermal annealed to form titanium silicide (TiSi) along the exposed portions of the source region 502' and body regions 526'. The titanium silicide forms second source-body contacts 556', which in combination with the first source-body contacts 546', electrically couples the body regions 526' to the source region 502'. At 556, the un-reacted portions of metal along the dielectric lined walls of the source-body trench are etched.

At 558, a second dielectric is deposited in the second plurality of trenches 552' to form source-body insulator regions 560'. In one implementation, the dielectric is deposited in the trenches 552' by a method such as decomposition of tetraethlorthosilicate (TEOS) or high density plasma fill (HDP).

At 564, a photo-resist is deposited and patterned by any well-known lithography process to form a gate contact resist layer (not shown). The gate contacts are formed in the periphery (not shown). At 566, the exposed portion of the gate insulators 524' are etched by any well-known anisotropic etching method (not shown). In one implementation, an ionic etchant interacts with the gate oxide exposed by the gate contact resist layer. The gate contact openings extend down to the gates 520'. At 568, the gate contact resist layer is removed utilizing an appropriate resist stripper or a resist ashing process (not shown).

At 570, a photo-resist is deposited and patterned by any well-known lithography process to form a drain contact resist layer (not shown). At 572, the exposed portion of the third sacrificial oxide is etched by any well-known anisotropic etching method (not shown). In one implementation, an ionic etchant interacts with the third sacrificial oxide and excess second dielectric material to form drain contact openings. The drain contact openings extend down to the drain regions. At 574, the drain contact resist layer is removed utilizing an appropriate resist stripper or a resist ashing process.

At 576, a second metal layer is deposited on the wafer. In one implementation, the second metal layer, such as aluminum, is deposited by any well-known method such as sputtering. The second metal layer covers the tops of the drains 534', the gate insulators 524' and the source-body contact insulators 560'. The second metal layer extends down into the gate contact openings to make an electrical contact to the gates 520' and down into the drain contact openings to make an electrical contact to the drains. The second metal layer is then patterned utilizing a photo-resist mask and selective etching method to form a gate contact layer (not shown) and a drain contact layer 578', at 578.

At 584, fabrication continues with various backside processes to form a source contact. The various processes typically include etching, deposition, doping, cleaning, annealing, passivation, cleaving and/or the like.

Figure 7:
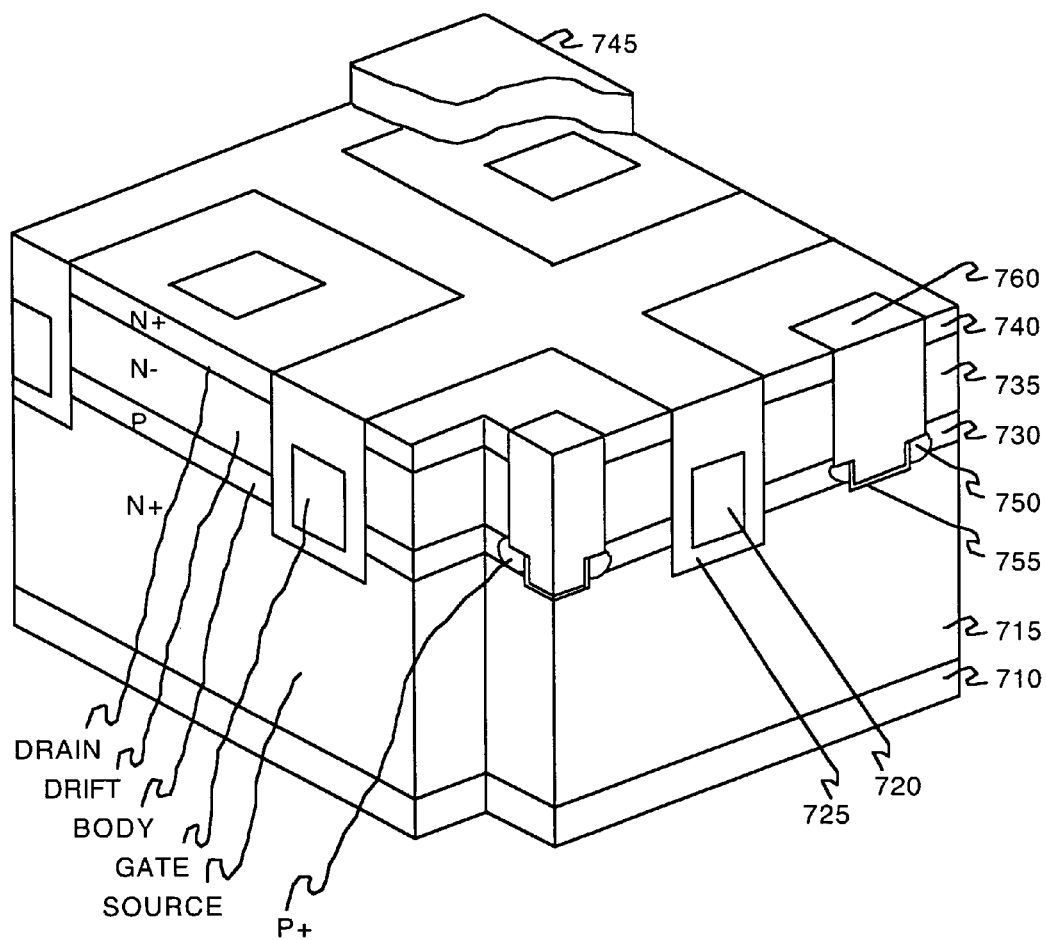
FIG. 7 shows a cross-sectional perspective view of a closed cell trench metal-oxide-semiconductor field effect transistor (TMOSFET), in accordance with one embodiment of the present invention.

Referring now to FIG. 7, a cross-sectional perspective view of a closed cell trench metal-oxide-semiconductor field effect transistor (TMOSFET) 700, in accordance with one embodiment of the present invention, is shown. The closed cell TMOSFET 700 comprises a source contact 710, a source region 715, a gate region 720, a gate insulator region 725, a plurality of body regions 730, a plurality of drift regions 735, a plurality of drain regions 740 and a drain contact 745. The closed cell TMOSFET 700 may further comprise a plurality of first source-body contact regions 750, a plurality of second source-body contact regions 755, and a plurality of source-body contact insulator regions 760.

The gate region 720, the gate insulator region 725, the plurality of body regions 730, the plurality of drift regions 735 and the plurality of drain regions 740 are disposed above the source region 715. A first portion of the gate region 720 and the gate insulator region 725 are formed as substantially parallel elongated structures. A second portion of the gate region 620 and the gate insulator region 625 are formed as substantially normal-to-parallel elongated structures (e.g., in the surface plane of the wafer, the second portion of the gate region and gate insulator region comprise a plurality of substantially parallel elongated structures formed at right angles to the first portion of the gate region and gate insulator region). The first and second portions of the gate region 720 are all interconnected and form a plurality of cells. The body regions 730 are disposed within the plurality of cells and above the source region 715. The drift regions 735 are disposed within the plurality of cells and above the body regions 730. The drain regions 740 are disposed within the plurality of cells and above the drift regions 735. The drain contact 745 is shown substantially cutaway to reveal the closed cell structure in greater detail. However, it is to be understood that the drain contact 745 overlays the entire surface of the core region.

The gate region 720 is surrounded by the gate insulator region 725. Thus, the gate region 720 is electrically isolated from the surrounding regions (e.g., source region 715, body regions 730, drift regions 735, drain regions 740 and drain contact 745) by the gate insulator region 725. The plurality of drain regions 740 are coupled to form a common drain of the device by the drain contact 745. From the above description, it is appreciated that the present closed cell TMOSFET 700 has its gate and drain terminals on the same side.

In one implementation, the source region 715 and the drain regions 740 may be heavily n-doped (N+) semiconductor, such as silicon doped with phosphorous or arsenic. The body regions 730 may be p-doped (P) semiconductor, such as silicon doped with boron. The drift regions 735 may lightly n-doped (N−) semiconductor, such as silicon doped with phosphorous or arsenic. The gate region 720 may be heavily n-doped (N+) or p-doped (P+) semiconductor, such as polysilicon doped with phosphorous or arsenic, or polysilicon doped with boron. The gate insulator region 725 may be an oxide, such as silicon dioxide.

In another implementation, the source region 715 and the drain regions 740 may be heavily p-doped (P+) semiconductor, such as silicon doped with boron. The body regions 730 may be lightly n-doped (N−) semiconductor, such as silicon doped with phosphorous or arsenic. The drift regions 735 may lightly p-doped (P−) semiconductor, such as silicon doped with boron. The gate region 720 may be heavily p-doped (P+) or n-doped (N+) semiconductor, such as polysilicon doped with boron, or polysilicon doped with phosphorous or arsenic. The gate insulator region 725 may be an oxide, such as silicon dioxide.

The body regions 730 are electrically coupled to the source region 715. In one implementation, the body regions 730 are coupled to the source region 715 by the first and second source-body contact regions 750, 755. The second source-body contact regions 750 may be a silicide, such as tungsten silicide. The first source-body contact regions 755 may be heavily p-doped (P+) semiconductor, such as silicon doped with boron. The source-body contact regions 750, 755 are electrically isolated from the surrounding drift regions 735 by the source-body contact insulator region 760. In one implementation, the source-body contact insulator region 760 may be an oxide, such as silicon dioxide. In another implementation, the source-body contact insulator region 760 may be p-doped polysilicon, silicon nitride or the like. The source-body contact regions 750, 755 and source-body insulator regions 760 are formed substantially in the middle of each cell. The front corner of the cross-sectional view is cut away to show the structure of the source-body contact regions 750, 755 and source-body insulator regions 760 in greater detail.

When the potential of the gate region 720, with respect to the source regions 715, is increased above the threshold voltage of the device 700, a conducting channel is induced in the body region 730 along the periphery of the gate insulator region 725. The device 700 will then conduct current between the plurality of drain regions 740 and the source region 715. Accordingly, the device 700 is in its on state. When the potential of the plurality of gate regions 720 is reduced below the threshold voltage, the channel is no longer induced. As a result, a voltage potential applied between the plurality of drain regions 740 and the source region 715 will not cause current to be conducted there between. Accordingly, the device 700 is in its off state and the junction of the body region 730 and the drift region 735 supports the voltage applied across the source region 715 and the drain regions 740

The width of the channel is a function of the sum of the perimeter, adjacent the gate insulator region 725, of the drain regions 740. Hence, the width of the channel region is substantially equal to the legacy closed cell TMOSFET 200. Therefore, the on resistance (Rds-on) of the device 700 is substantially equal to the legacy closed cell TMOSFET 200.

In the legacy closed cell TMOSFET 200, a lead wire is utilized to connect the source on the die to an external device. The source wire lead increases the effective inductance of the source in the legacy closed cell TMSOFET 200. The source of the present closed cell TMOSFET 700 may be connected directly to a PCB or a legacy closed cell TMOSFET 200 (e.g., source contact covers the bottom of the die and may be wave soldered to a PCB or the like). The wire lead of the source may be eliminated, and therefore the effective source inductance of the present closed cell TMOSFET 700 is reduced.

The present closed cell TMOSFET 700 may be fabricated such that the gate region 720 does not overlap the drain regions 740. Therefore, the separation of the gate region 720 and drain regions 740 is increased. The increased separation reduces the gate-to-drain capacitance (Cgd). Accordingly, the gate-to-drain capacitance (Cgd) of the present closed cell TMOSFET 700 is reduced as compared to the legacy closed cell TMOSFET 200.

In addition, the present closed cell TMOSFET 700 has a relatively large gate-to-source capacitance (Cgs) as a result of the overlap of the gate region 720 with the source region 715. Therefore, the gate-to-source capacitance (Cgs) of the present closed cell TMOSFET 700 is generally greater than the gate-to-source capacitance (Cgs) of the legacy closed cell TMOSFET 200. The ratio of the gate-to-drain capacitance (Cgd) to the source-to-drain capacitance (Cgs), a figure of merit, of the present closed cell TMOSFET 700 is less (e.g., better figure of merit) than the legacy closed cell TMOSFET 200. It is also appreciated that the ratio of the gate-to-drain capacitance (Cgd) to gate-to-source capacitance (Cgs) may be adjusted by adjusting the thickness of the portion of the gate insulator region 725 proximate the source region 715 and/or the portion of the gate insulator region 725 proximate the drain regions 740.

Overlap between the gate region 725 and the drift regions 735 causes an increase in accumulation in the conduction channel during the on state of the device 700. Thus, if the gate region 720 extends to overlap the body regions 730 and the drift regions 735, the on resistance (Rds-on) of the present closed cell TMOSFET 700 may be further reduced.

Although not shown, it is also appreciated that the closed cell TMOSFET 700 may further include a super source region. The super source region is formed as a substantially parallel elongated structure disposed above the gate region 720. The gate insulator region 725 also surrounds the super source region and electrically isolates the super source region from the surrounding regions (e.g., gate region 720, body regions 730, drift regions 735, drain regions 740 and drain contact 745). The super source region is electrically coupled to the source region 715 (e.g., by a contact in the periphery region). The super source region is adapted to further decrease the on state resistance (Rds-on) and to increases the breakdown voltage in the off state of the closed cell TMOSFET 700.

Figure 8A:
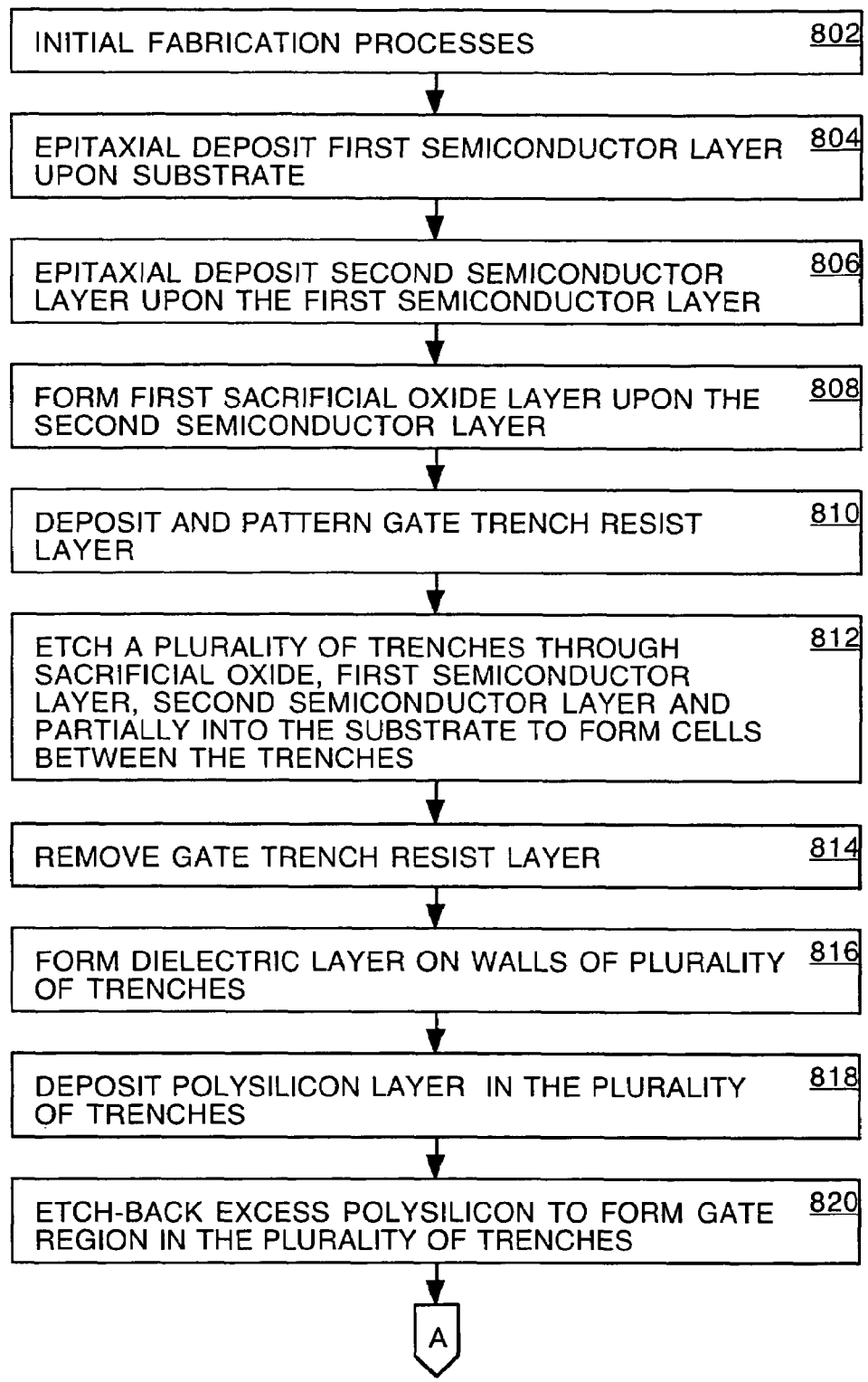
FIGS. 8A-8D show a flow diagram of a method of fabricating a closed cell trench metal-oxide-semiconductor field effect transistor (TMOSFET), in accordance with one embodiment of the present invention.

Referring now to FIGS. 8A-8D, a flow diagram of a method of fabricating a closed cell trench metal-oxide-semiconductor field effect transistor (TMOSFET), in accordance with one embodiment of the present invention, is shown. The method of fabricating the closed cell TMOSFET, in accordance with one embodiment of the present invention, is illustrated in FIGS. 9A-9N. As depicted in FIGS. 8A and 9A, the process begins, at 802, with various initial processes upon a substrate 802', such as cleaning, depositing, doping, etching and/or the like. In one implementation, the substrate 802' comprises silicon heavily doped with phosphorous (N+). The semiconductor substrate 802' will substantially comprise a source region of the TMOSFET upon completion of the fabrication processes.

At 804, a first semiconductor layer 804' is epitaxial deposited upon the substrate 802'. In one implementation, the first semiconductor layer 804' comprises heavily p-doped (P+) silicon. The epitaxial deposited silicon may be doped by introducing the desired impurity, such as boron, into the epitaxal reaction chamber. Alternatively, the doping of the first semiconductor layer may be achieved by a high energy implantation with a p-type dopant, such as boron.

At 806, a second semiconductor layer 806' is epitaxial deposited upon the first semiconductor layer 804'. In one implementation, the second semiconductor layer 806' comprises n-doped (N) silicon. The epitaxial deposited silicon may be doped by introducing the desired impurity, such as phosphorous or arsenic, into the reaction chamber. Alternatively, the doping of the second semiconductor layer may be achieved by a high energy implantation with an n-type dopant, such as phosphorous or arsenic.

At optional process 808, a first sacrificial oxide layer 808' is formed upon the second semiconductor layer 806'. In one implementation, the sacrificial oxide layer 808' is formed by oxidizing the surface of the second semiconductor layer 806'. At 810, a photo-resist is deposited and patterned by any well-know lithography process to form a gate trench resist layer 810'.

At 812, the exposed portions of the sacrificial oxide layer 808', the second semiconductor layer 806', the first semiconductor layer 804' and a portion of the substrate 802' are etched by any well-known anisotropic etching method (e.g., dry etch). In one implementation, an ionic etchant interacts with the sacrificial oxide layer 808', second semiconductor layer 806', first semiconductor layer 804' and the substrate 802' exposed by the gate trench resist layer 810'. The etching process results in plurality of trenches 812' having a plurality of cells disposed therein. The plurality of trenches 812' are formed having a first portion of substantially parallel structures and a second portion of substantially normal-to-parallel structures.

At 814, the gate trench resist layer 810' is removed utilizing an appropriate resist stripper or a resist ashing process. At 816, a first dielectric 816' is formed on the walls of the plurality of trenches 812'. In one implementation, the first dielectric 816' is formed by oxidizing the exposed surface of the silicon to form a silicon dioxide layer. The resulting dielectric 816' along the trench walls forms a first portion of gate insulator regions.

At 818, a polysilicon layer 820' is deposited in the first plurality of trenches 812'. In one implementation, the polysilicon 820' is deposited in the trenches 812' by a method such as decomposition of silane ($SiH_4$). The polysilicon may be doped with n-type impurity such as phosphorous or arsenic. The polysilicon may be doped by introducing the impurity during the deposition process. At 820, an etch-back process is performed to remove excess polysilicon material to form gate regions. The polysilicon layer is etched back such that the desired separation/overlap between the gate region formed from the polysilicon layer in the trenches and the subsequently formed body, drift and drain regions. In one implementation, the excess polysilicon is removed by a combination of a chemical mechanical polishing (CMP) process and an anisotropic etching method.

In an optional embodiment, a dielectric layer is formed over the gate. In one implementation, the polysilicon of the gate is oxidized to form a silicon dioxide. A second polysilicon layer is deposited over the dielectric layer formed upon the gate. Another etch back process is utilizes to form a super source from the second polysilicon layer.

Figure 8B:
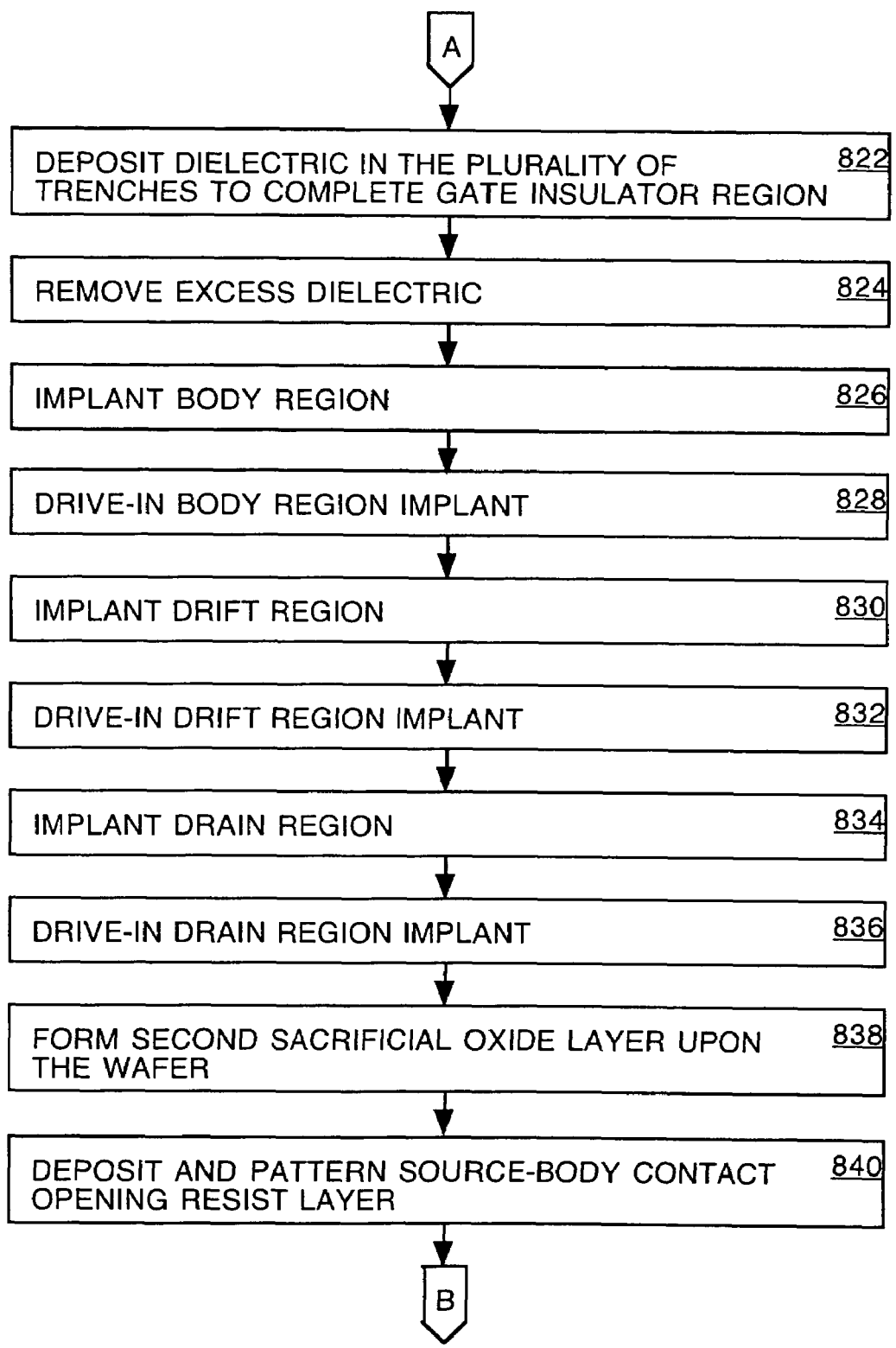
Figure 9A:
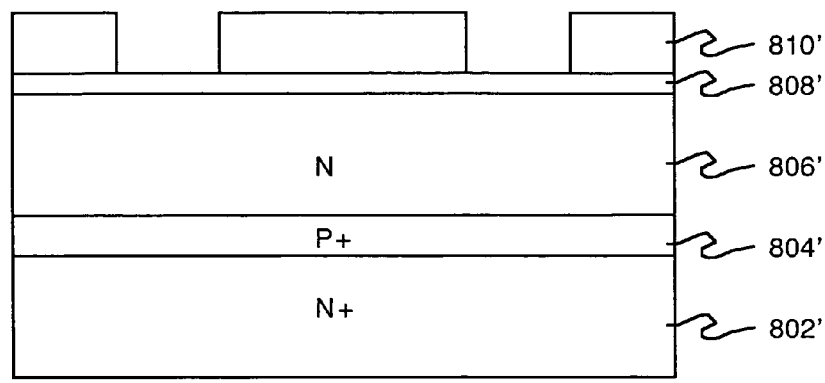
FIGS. 9A-9O show a cross-sectional plane view of various phases of fabricating a closed cell trench metal-oxide-semiconductor field effect transistor (TMOSFET), in accordance with one embodiment of the present invention.
Figure 9B:
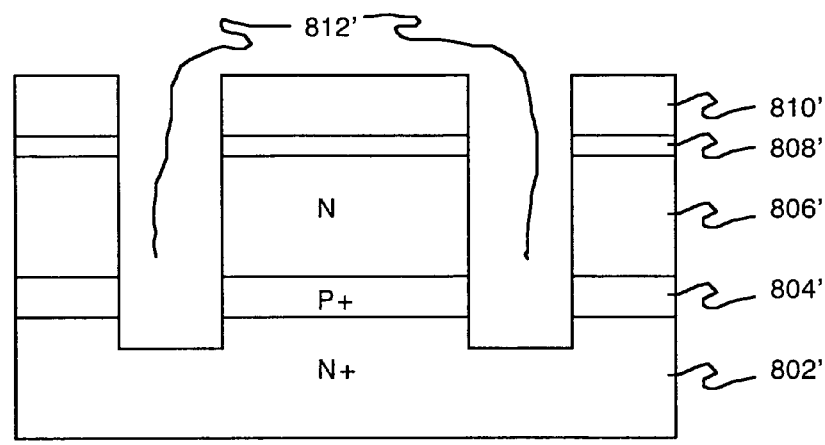
Figure 9C:
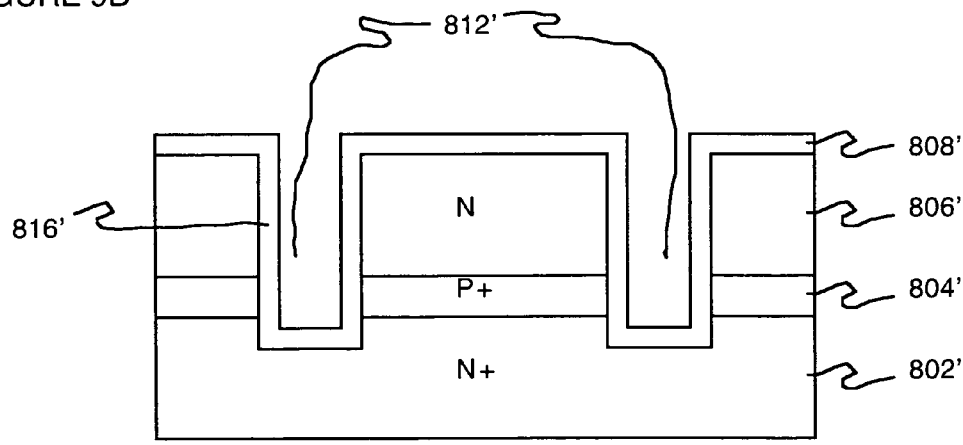
Figure 9D:
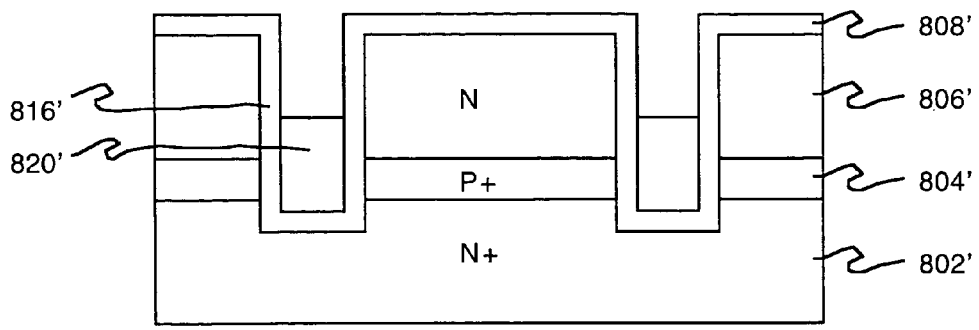
Figure 9E:
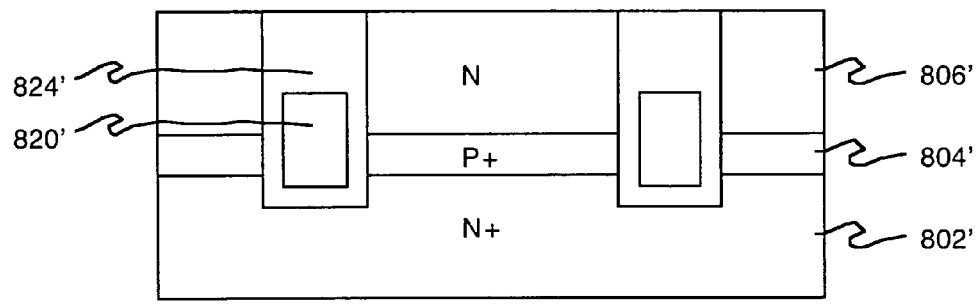
Figure 9F:
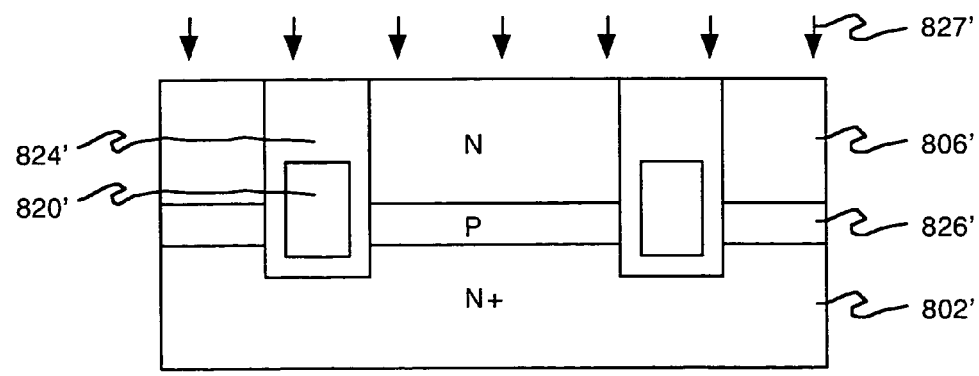
Figure 9G:
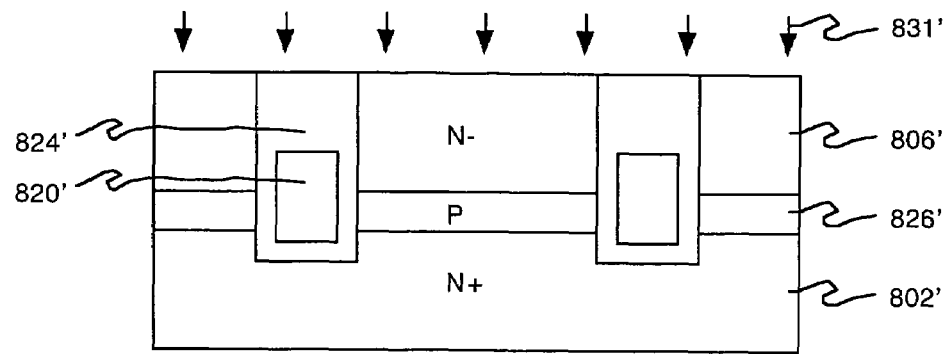
Figure 9H:
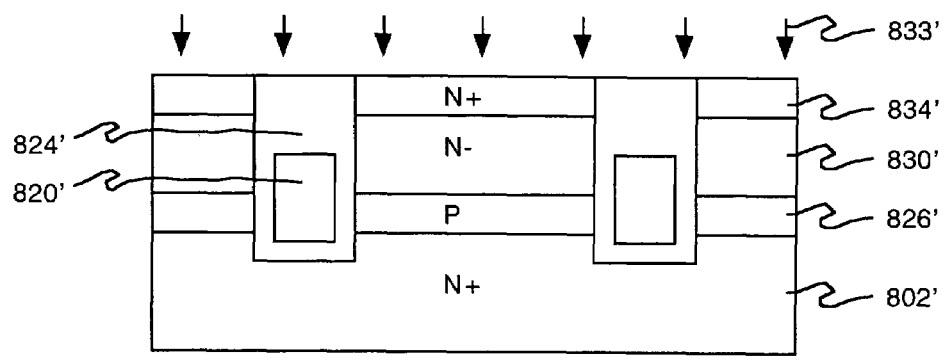
Figure 9I:
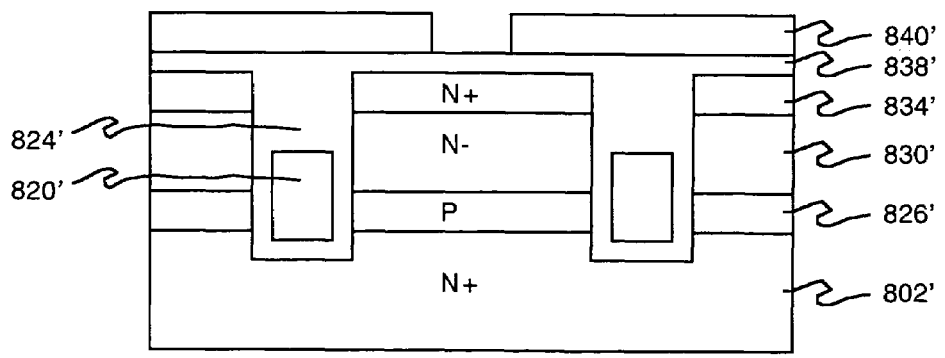

As depicted in FIGS. 8B and 9E, a second dielectric 824' is deposited in the first plurality of trenches 812', at 822. In one implementation, the dielectric is deposited in the trenches by a method such as decomposition of tetraethlorthosilicate (TEOS) or high density plasma fill (HDP). At 824, excess dielectric material is removed to complete the gate insulator region. In one implementation, the excess dielectric is removed by a chemical mechanical polishing (CMP) process.

At 826, the first semiconductor layer 804' is p-doped to adjust the doping concentration of the body region 826' between the plurality of trenches 812'. In one implementation, the doping process implants a p-type impurity 827', such as boron, in the first semiconductor layer 804'. At 828, a thermal cycle is utilized to drive (e.g., diffusion) the implanted impurity substantially through the depth of the first semiconductor layer 804', thereby forming the body regions 826'. At 830, the second semiconductor layer 806' is n-doped. In one implementation, the doping process implants an n-type impurity 831', such as phosphorous or arsenic, in the second semiconductor layer 806'. At 832, a second thermal cycle is utilized to drive (e.g., diffusion) the implanted impurity substantially through the depth of the second semiconductor layer 806'. At 834, the upper portion of the second semiconductor layer 806' is heavily n-doped to form drain regions 834' in the upper portion and drift regions 830' in the lower portion of the second semiconductor layer 806' between the plurality of trenches 812'. In one implementation, the doping process implants an n-type impurity 833', such as phosphorous or arsenic, in the upper portion of the second semiconductor layer 806'. At 836, a third thermal cycle may be utilized to drive the drain region implant to achieve the desired depth of the drain regions 834'.

At 838, a second sacrificial oxide layer 838' is formed upon the wafer. In one implementation, the second sacrificial oxide 838' is formed by oxidizing the surface of the wafer. At 840, a photo-resist is deposited and patterned by any well-know lithography process to form a source-body contact opening resist layer 840'.

Figure 8C:
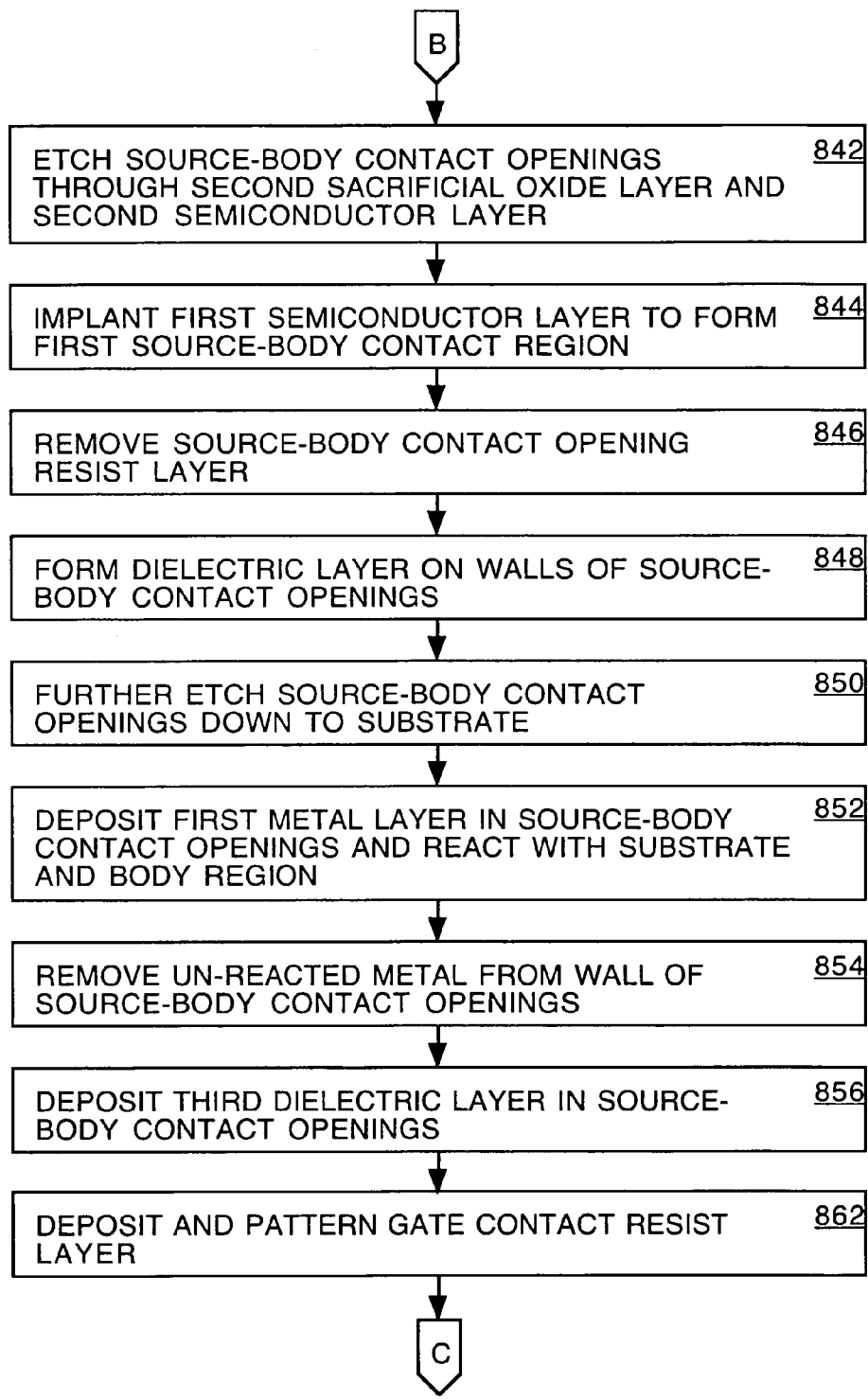
Figure 9J:
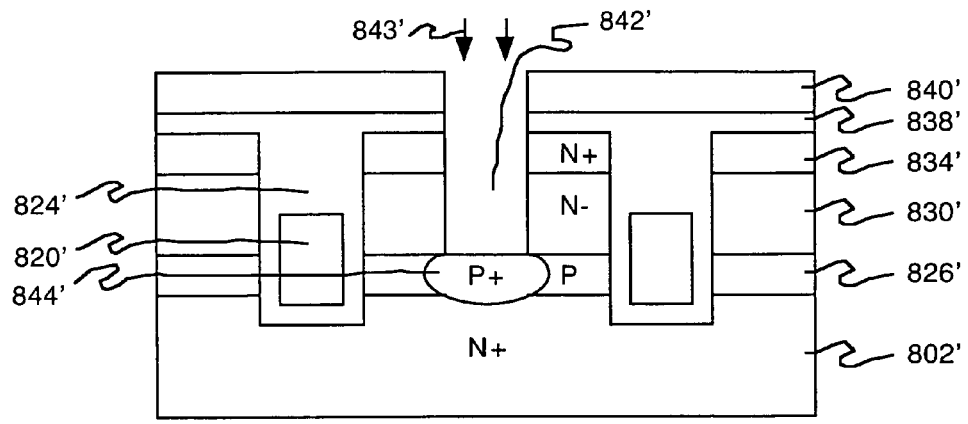
Figure 9K:
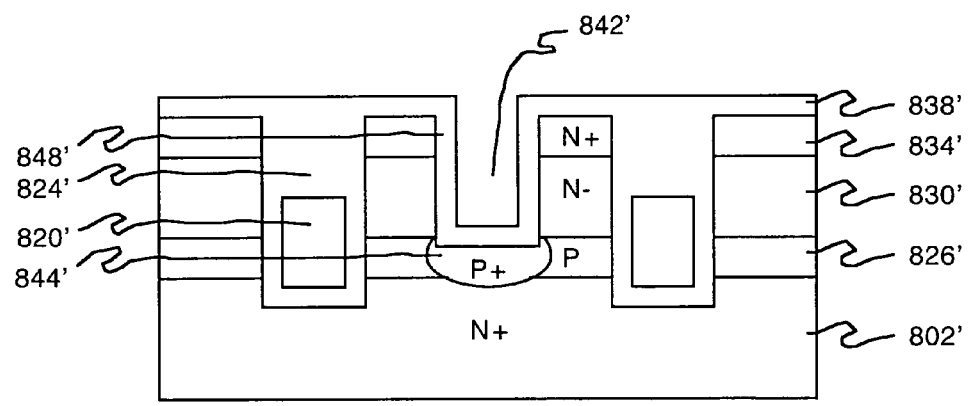
Figure 9L:
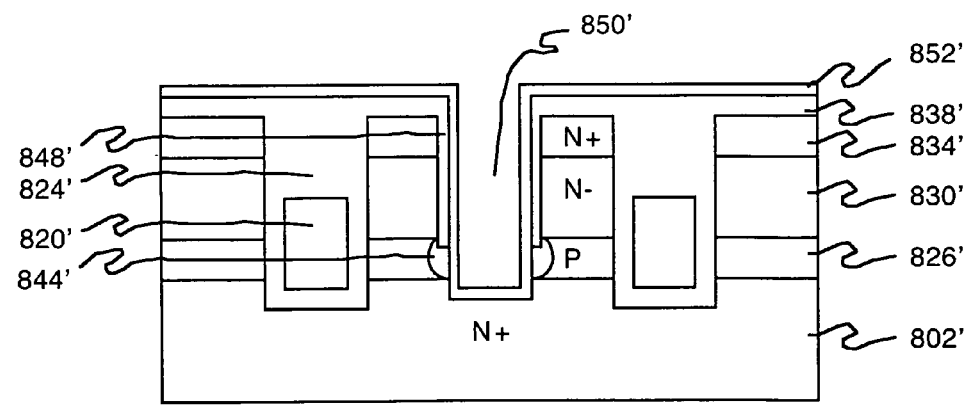
Figure 9M:
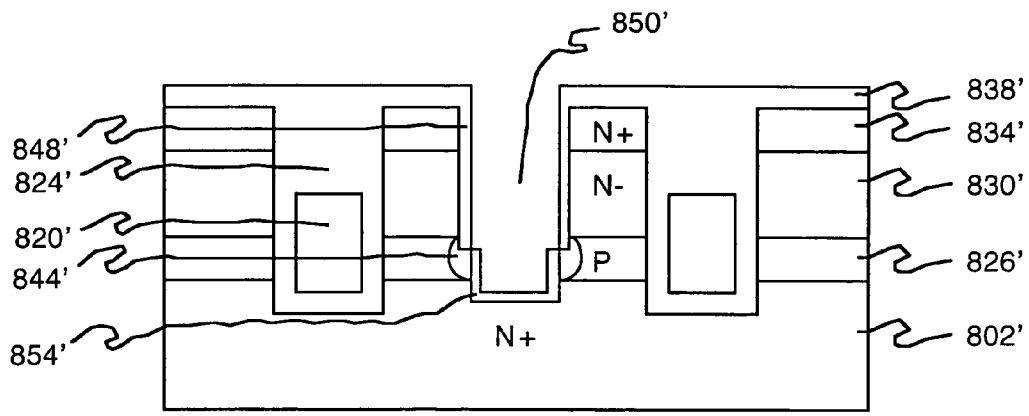
Figure 9N:
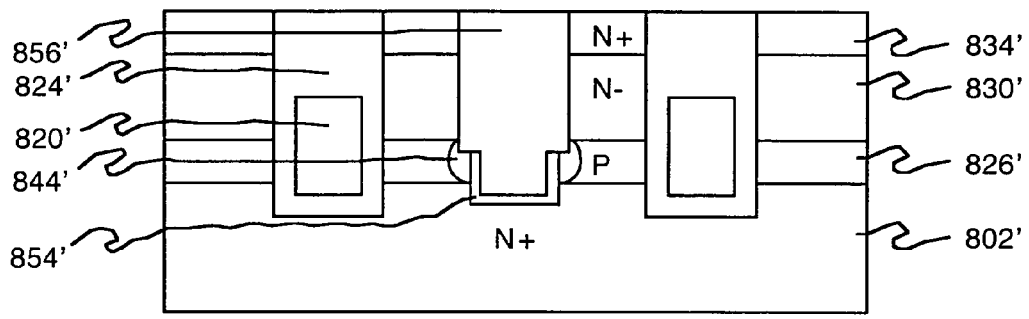
Figure 9O:
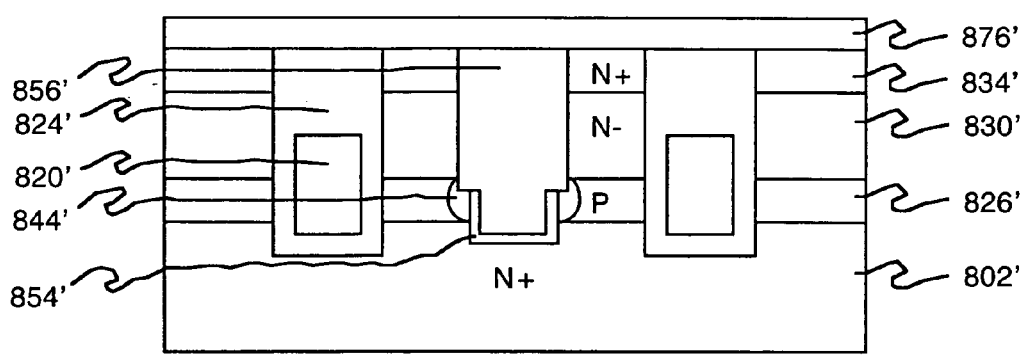

As depicted in FIGS. 8C and 9J, the exposed portions of the second sacrificial oxide layer 838', the source regions 834' and the drift regions 830' are etched by any well-known anisotropic etching method, at 842. In one implementation, an ionic etchant interacts with sacrificial oxide layer 836' the source regions 834' and the drift regions 830' exposed by the source-body contact opening resist layer 840'. The etching process forms a plurality of source-body contact opening 842'. Each of the source-body contact openings 842' are disposed within the cells formed by the plurality of trenches 812'.

At 844, the exposed portion of the body regions 826' are heavily doped to form first source-body contact regions 844'. In one implementation, the doping process implants a p-type impurity 843', such as boron, in the body region 826'. A thermal cycle may be utilized to drive the source-body implant substantially throughout the exposed portion of the body regions 826'. It is appreciated that a portion of the implant will diffuse laterally into the adjacent un-exposed portion of the body regions 826'.

At 846, the source-body contact opening resist layer 840' is removed utilizing an appropriate resist stripper or a resist ashing process. At 848, a dielectric 848' is formed on the walls of the source-body contact openings 842'. In one implementation, the dielectric 848' is formed by oxidizing the exposed surface of the silicon to form a silicon dioxide layer.

At 850, the portion of the dielectric 848' formed at the bottom of the source-body contact openings 842' and the exposed portion of the body regions 826' are etched by any well-known anisotropic etching method. The etching process is performed until the source-body contact openings 850' extend partially into the source region 802' (e.g., substrate). The etching process leaves the adjacent portions of the body regions 826' and source region 802' exposed, while the drift regions 830' and drain regions 834' remain protected by the dielectric layer 848'. It is appreciated that the portions of the source-body contact implant 844' that diffused laterally into the un-exposed portion of the body regions 826' substantially remains after the present etching process. The remaining portions of the source-body contact implant form first source-body contacts 844'.

At 852, a first metal 852' is deposited in the bottom of the source-body contact openings 850' and reacted with the exposed portions of the body regions 826' and the source region 802'. In one implementation, titanium is sputtered in the openings and rapidly thermal annealed to form titanium silicide (TiSi). The titanium silicide forms second source-body contacts 854', which in combination with the first source-body contacts electrically coupled the body regions 826' to the source 802'. At 854, the un-reacted portion of the titanium along the dielectric lined walls of the source-body contact openings 850' is etched away.

At 856, a third dielectric layer is deposited in the source-body contact openings 850' to form a source-body insulator region 856'. In one implementation, the dielectric 856' is deposited in the openings 850' by a method such as decomposition of tetraethlorthosilicate (TEOS) or high density plasma fill (HDP).

Figure 8D:
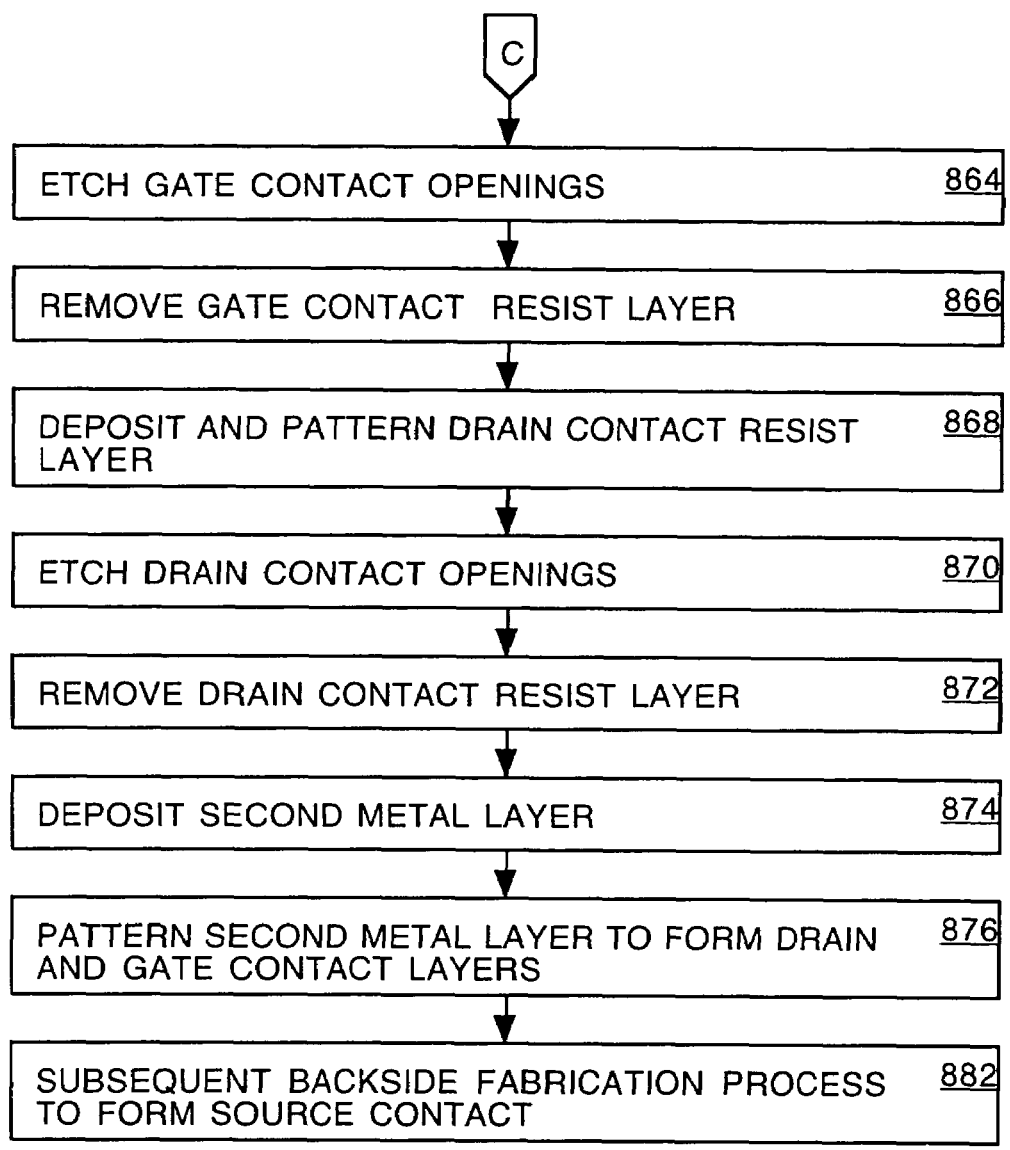

At 862, a photo-resist is deposited and patterned by any well-known lithography process to form a gate contact resist layer (not shown). The gate contacts are formed in the periphery region. As depicted in FIG. 8D, the exposed portion of the gate insulator region 822' is etched by any well-known anisotropic etching method to form gate contacts in the periphery region (not shown), at 864. In one implementation, an ionic etchant interacts with the gate oxide exposed by the gate contact resist layer. The gate contact openings extend down to the gate regions 820'. At 866, the gate contact resist layer is removed utilizing an appropriate resist stripper or a resist ashing process.

At 868, a photo-resist is deposited and patterned by any well-known lithography process to form a drain contact resist layer (not shown). At 870, the exposed portion of the excess dielectric material and the third sacrificial oxide in the core is etched by any well-known anisotropic etching method to a form drain contact opening (not shown). In one implementation, an ionic etchant interacts with the excess dielectric material and the third sacrificial oxide to form a drain contact opening. The drain contact opening extends down to the drain regions 834'. At 872, the drain contact resist layer is removed utilizing an appropriate resist stripper or a resist ashing process (not shown).

At 874, a second metal layer is deposited on the wafer. In one implementation, the second metal layer, such as aluminum, is deposited by any well-known method, such as sputtering. The metal layer covers the tops of the drain regions 834', the gate insulator regions 856', the source-body contact insulator regions 856'. The second metal layer extends down into the gate contact openings to make an electrical contact to the gate regions and down into the drain contact openings to make an electrical contact to the drain regions 834'. The second metal layer is then patterned utilizing a photo-resist mask and selective etching method to form a gate contact layer (not shown) and a drain contact layer 876', at 876.

At 882, fabrication continues with various backside processes to form a source contact. The various processes typically include etching, deposition, doping, cleaning, annealing, passivation, cleaving and/or the like.

Figure 10A:
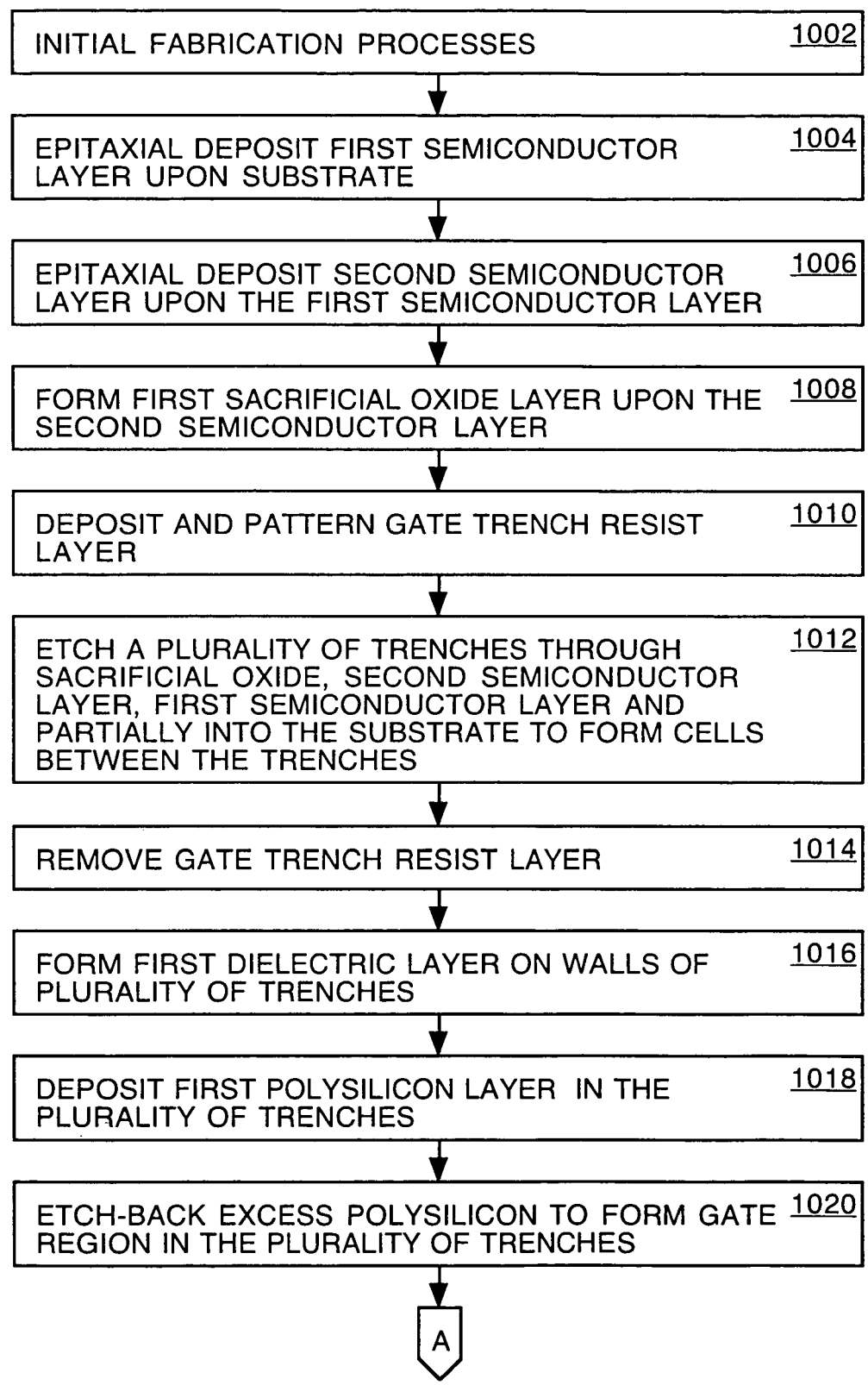
FIGS. 10A-10D show a flow diagram of a method of fabricating a closed cell trench metal-oxide-semiconductor field effect transistor (TMOSFET), in accordance with another embodiment of the present invention.

Referring now to FIGS. 10A-10D, a flow diagram of a method of fabricating a closed cell trench metal-oxide-semiconductor field effect transistor (TMOSFET), in accordance with another embodiment of the present invention, is shown. The method of fabricating the closed cell TMOSFET, in accordance with another embodiment of the present invention, is illustrated in FIGS. 11A-11O. As depicted in FIGS. 10A and 11A, the process begins, at 1002, with various initial processes upon a substrate 1002', such as cleaning, depositing, doping, etching and/or the like. In one implementation, the substrate 1002' comprises silicon heavily doped with phosphorous (N+). The semiconductor substrate 1002' will substantially comprise a source region of the TMOSFET upon completion of the fabrication process.

At 1004, a first semiconductor layer 1004' is epitaxial deposited upon the substrate 1002'. In one implementation, the first semiconductor layer 1004' comprises heavily p-doped (P+) silicon. The epitaxial deposited silicon may be doped by introducing the desired impurity, such as boron, into the epitaxal reaction chamber. Alternatively, the doping of first semiconductor layer 1004' may be achieved by a high energy implantation with a p-type dopant, such as boron.

At 1006, a second semiconductor layer 1006' is epitaxial deposited upon the first semiconductor layer 1004'. In one implementation, the second semiconductor layer comprises lightly n-doped (N−) silicon. The epitaxial deposited silicon may be doped by introducing the desired impurity, such as phosphorous or arsenic, into the reaction chamber. Alternatively, the doping of second semiconductor layer 1006' may be achieved by a high energy implantation with an n-type dopant, such as phosphorous or arsenic.

At 1008, a first sacrificial oxide layer 1008' is formed upon the second semiconductor layer 1006'. In one implementation, the sacrificial oxide layer 1008' is formed by oxidizing the surface of the second semiconductor layer 1006'. At 1010, a photo-resist is deposited and patterned by any-well know lithography process to form a gate trench resist layer 1010'.

At 1012, the exposed portions of the first sacrificial oxide layer 1008', the second semiconductor layer 1006', the first semiconductor layer 1004' and a portion of the substrate 1002' are etched by any well-known anisotropic etching method (e.g., dry etch). In one implementation, an ionic etchant interacts with the sacrificial oxide layer 1008', second semiconductor layer 1006', first semiconductor layer 1004' and the substrate 1002' exposed by the gate trench resist layer 1010'. The plurality of trenches 1012' are formed having a first portion of substantially parallel structures and a second portion of substantially normal-to-parallel structures.

At 1014, the gate trench resist layer 1010' is removed utilizing an appropriate resist stripper or a resist ashing process. At 1016, a first dielectric layer 1016' is formed on the walls of the plurality of trenches 1012'. In one implementation, the dielectric layer 1016' is formed by oxidizing the exposed surface of the silicon to form a silicon dioxide layer. The resulting dielectric layer 1016' along the trench walls forms a first portion of a gate insulator region.

At 1018, a first polysilicon layer is deposited in the plurality of trenches. In one implementation, the polysilicon is deposited in the trenches by a method such as decomposition of silane ($SiH_4$). The polysilicon may be doped with n-type impurity such as phosphorous or arsenic. The polysilicon may be doped by introducing the impurity during the deposition process. At 1020, an etch-back process is performed to remove excess polysilicon material to form the gate regions 1020'. The polysilicon layer is etched back such that the desired separation/overlap between the gate region formed from the polysilicon layer in the trenches and the subsequently formed body, drift and drain regions. In one implementation, the excess polysilicon is removed by a combination of a chemical mechanical polishing (CMP) process and an anisotropic etching method.

Figure 10B:
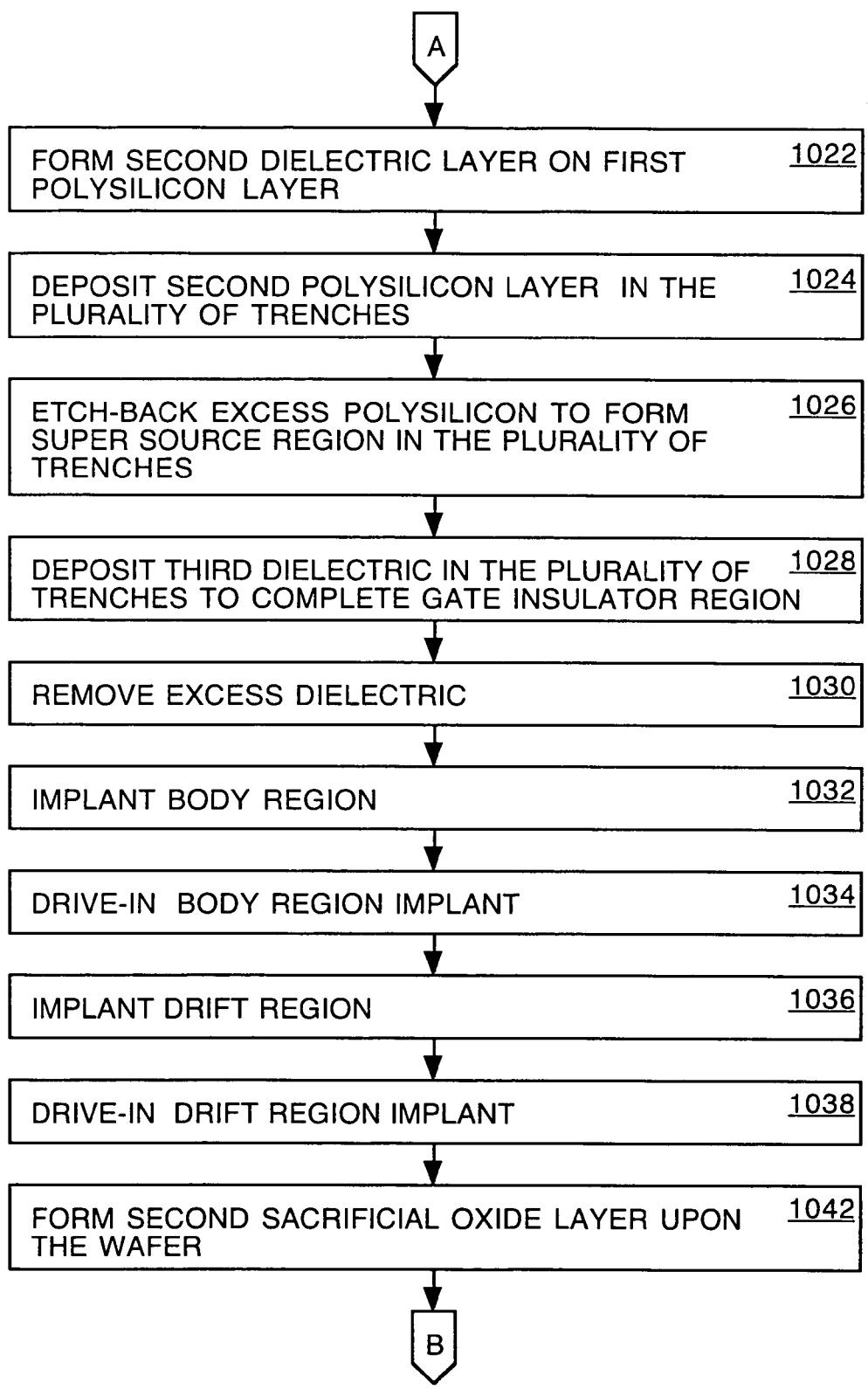
Figure 11A:
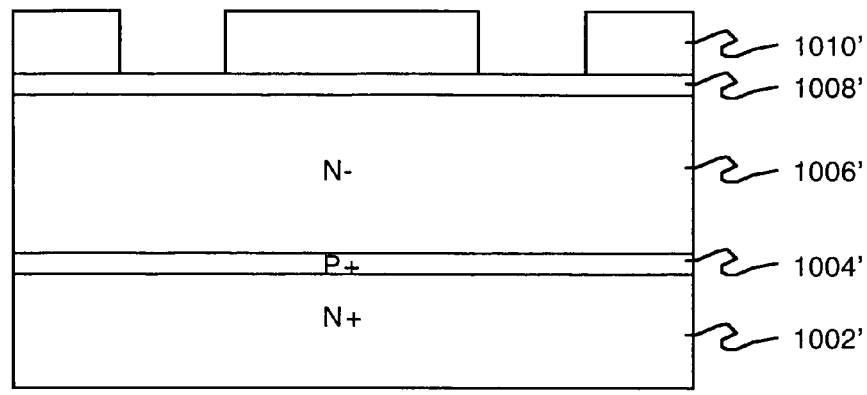
FIGS. 11A-11N show a cross-sectional plane view of various phases of fabricating a closed cell trench metaloxide-semiconductor field effect transistor (TMOSFET), in accordance with another embodiment of the present invention.
Figure 11B:
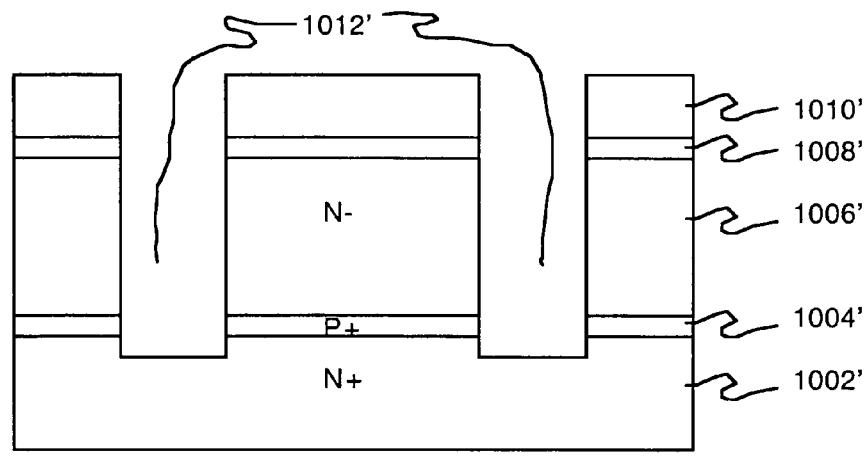
Figure 11C:
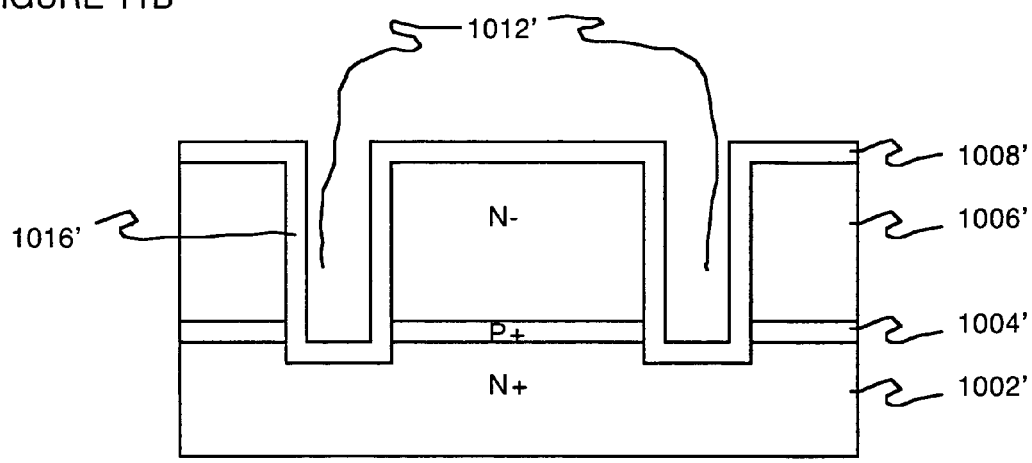
Figure 11D:
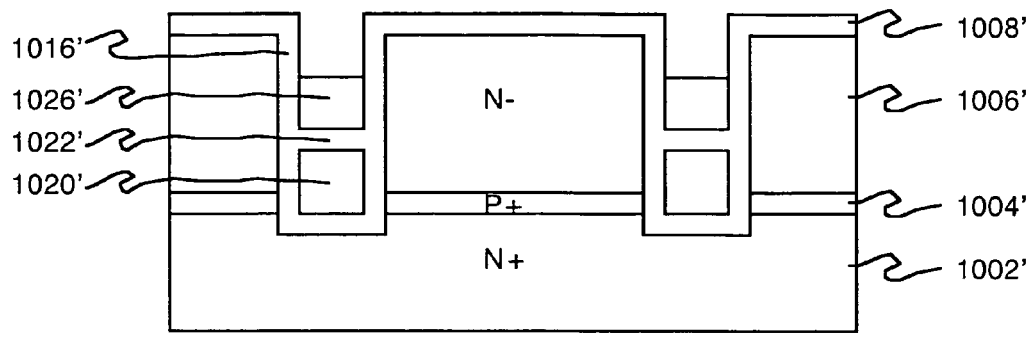
Figure 11E:
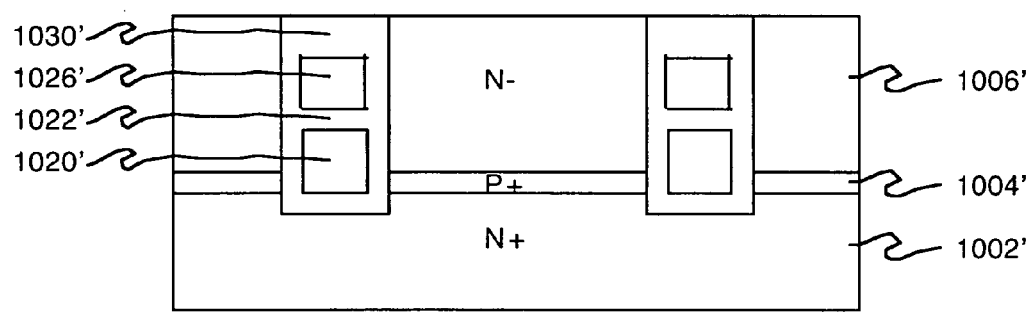
Figure 11F:
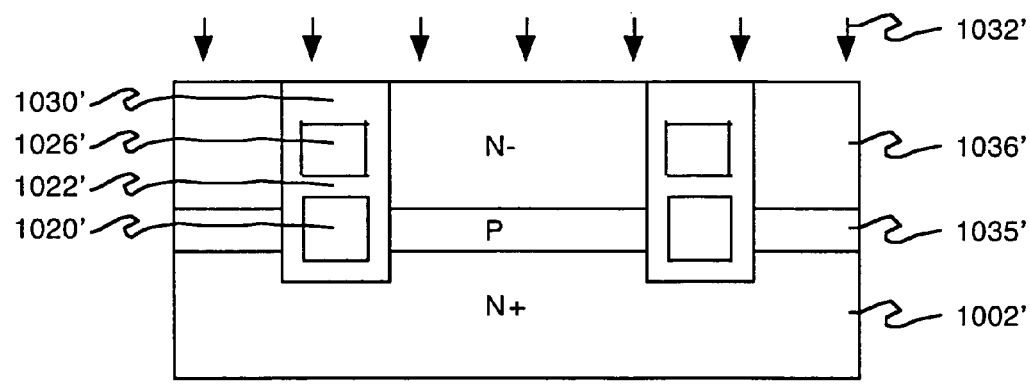
Figure 11G:
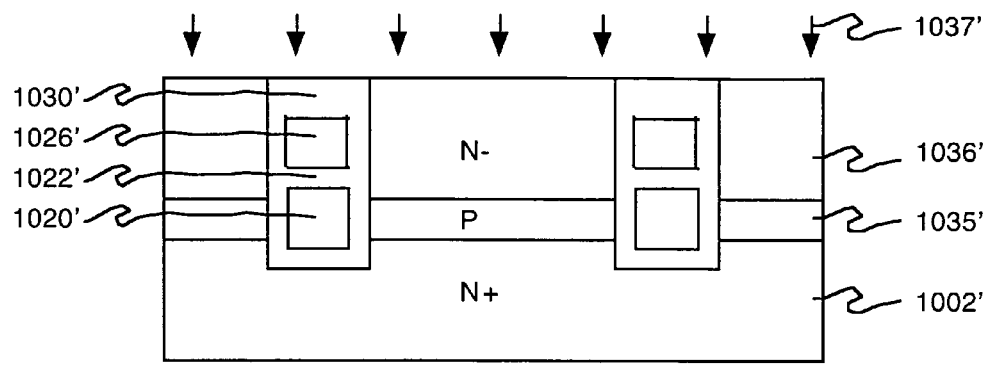

Referring now to FIGS. 10B and 11E, a second dielectric layer 1022' is formed over the gate regions 1020', at optional process 1022. In one implementation, the polysilicon of the gate 1020' is oxidized to form silicon dioxide. At optional process 1024, a second polysilicon layer is deposited over the dielectric layer 1022' formed upon the gate 1020'. At optional process 1026, another etch back process is utilizes to form super source regions 1026' from the second polysilicon layer.

At 1028, a third dielectric layer is deposited in the plurality of trenches 1012'. In one implementation, the dielectric is deposited utilizing a sub-atmospheric chemical vapor deposition (SACVD) process. At 1030, excess dielectric material is removed to complete the gate insulator region 1030'. In one implementation, the excess dielectric material is removed by a chemical mechanical polishing (CMP) process.

At 1032, the lower portion of the second semiconductor layer 1004' is doped with a p-type impurity. In one implementation, the doping process implants a p-type impurity 1032', such as boron, in the lower portion of the second semiconductor layer 1006'. At optional process 1034, a thermal cycle is utilized to drive (e.g., diffusion) the implanted impurities, thereby forming the body regions 1035'. It is appreciated that the thermal cycle will cause the impurities in the first semiconductor layer 1004' and the implanted impurities, from process 1034, in the lower portion of the second semiconductor layer 1006' to diffuse such that body regions 1035' are formed substantially from the first semiconductor layer 1004' and the lower portion of the second semiconductor layer 1006'.

At 1036, the upper portion of the second semiconductor layer 1006' is n-doped to adjust the doping concentration of the drift region 1036'. In one implementation, the doping process implants an n-type impurity 1037', such as phosphorous or arsenic, in the upper portion of the second semiconductor layer 1006'. At optional process 1038, a second thermal cycle is utilized to drive (e.g., diffusion) the second implanted impurities, thereby forming the drift regions 1036'.

Figure 10C:
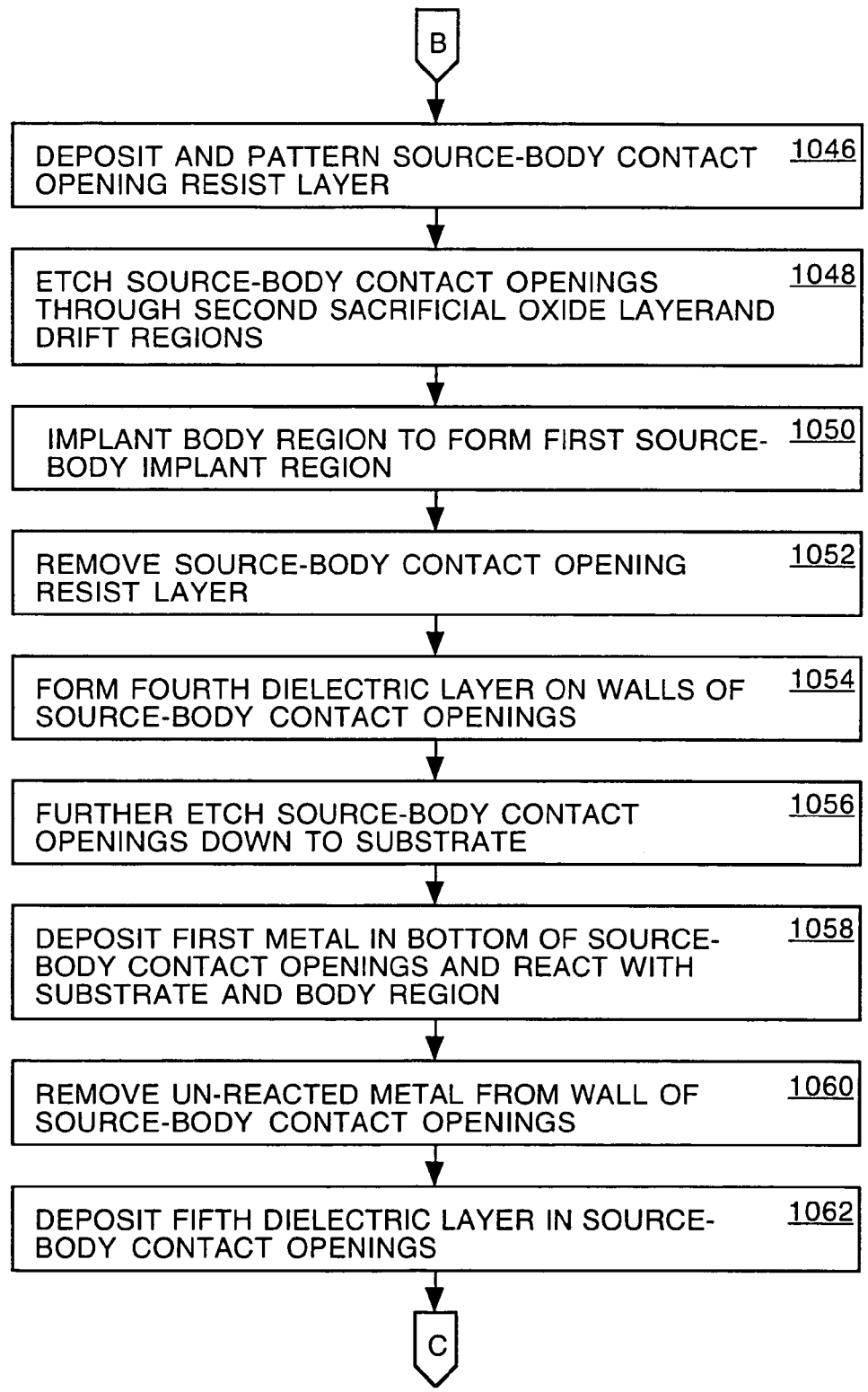
Figure 11H:
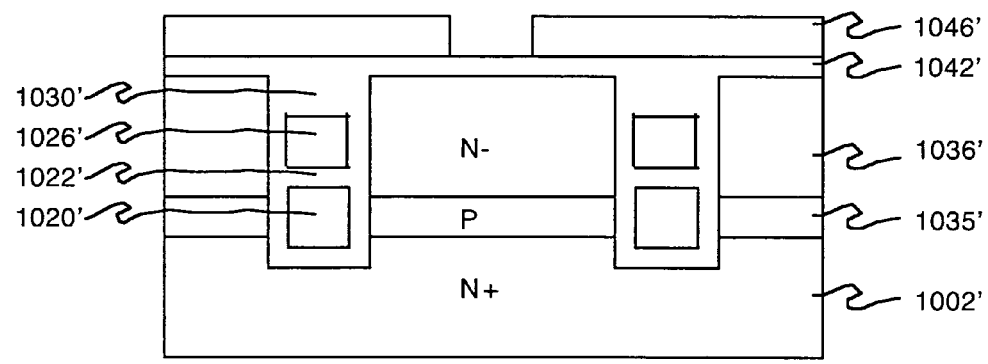
Figure 11I:
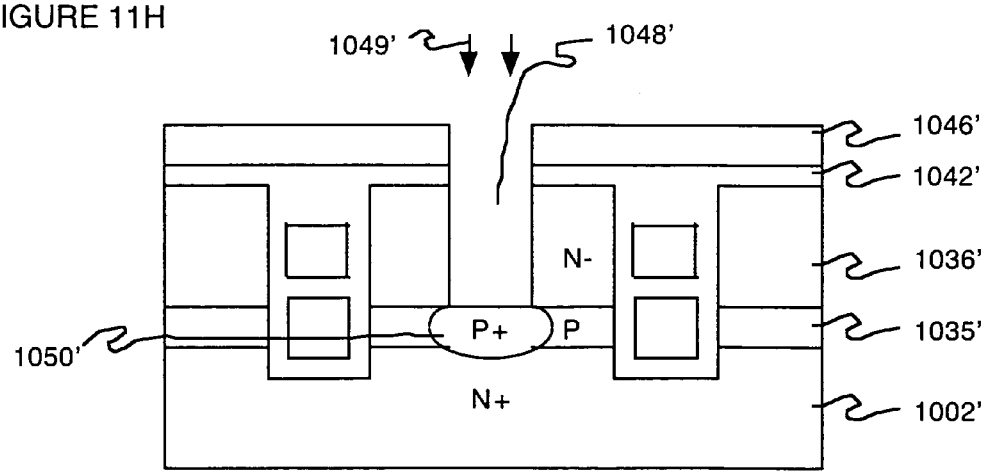
Figure 11J:
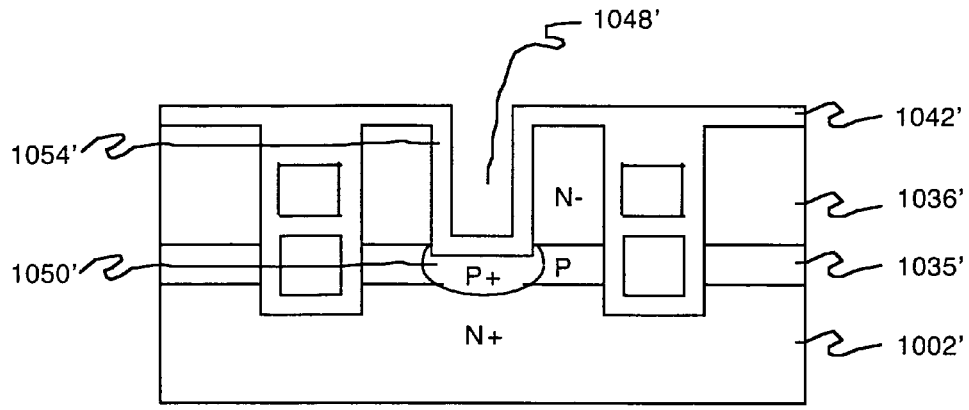
Figure 11K:
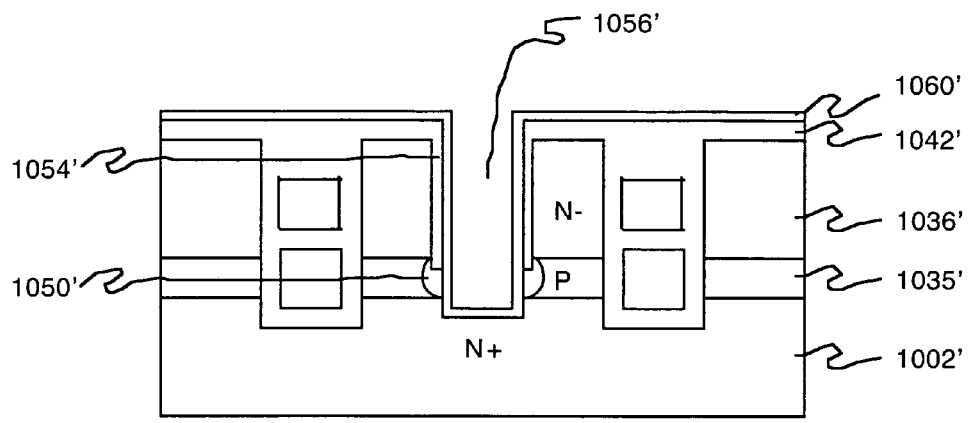
Figure 11L:
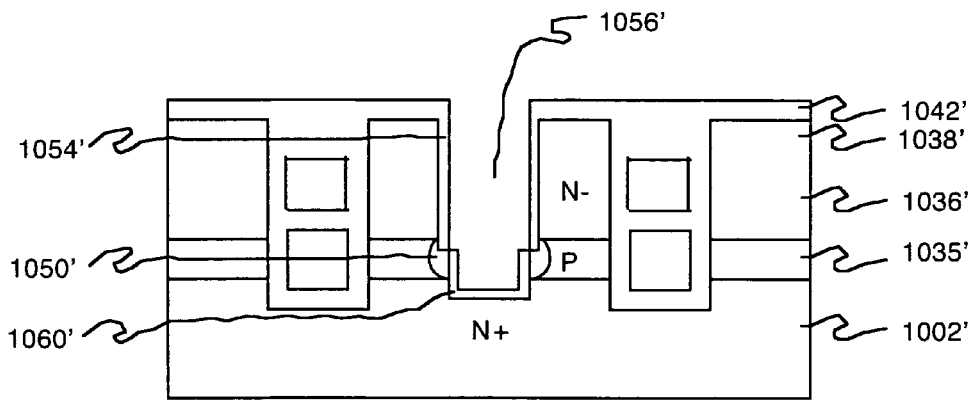
Figure 11M:
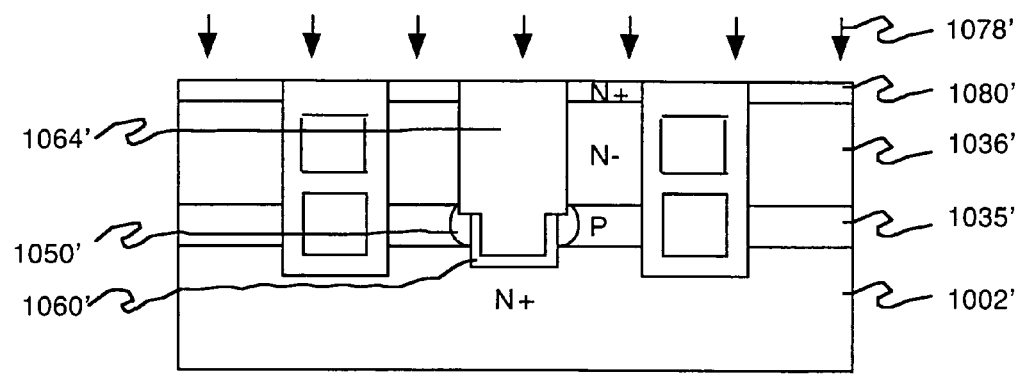
Figure 11N:
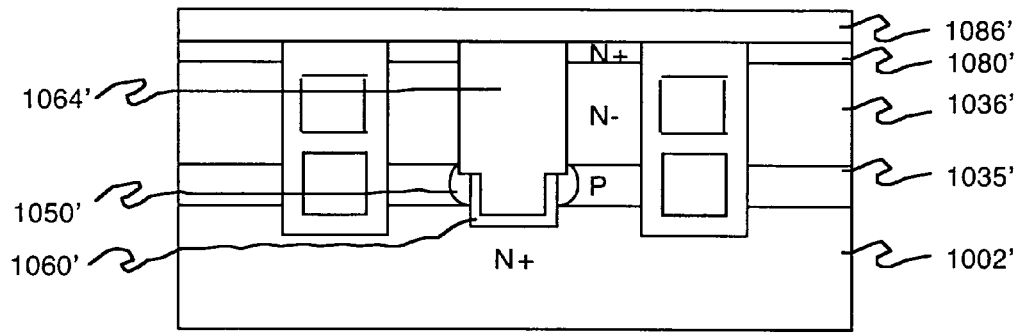

At 1042, a second sacrificial oxide layer 1042' is formed upon the wafer. In one implementation, the sacrificial oxide layer is formed by oxidizing the surface of the wafer. As depicted in FIGS. 10C and 11H, a photo-resist is deposited and patterned by any well-know lithography process to form a source-body contact opening resist layer 1046', at 1046.

At 1048, the exposed portions of the second sacrificial oxide layer 1042' and drift regions 1036' are etched by any well-known anisotropic etching method. In one implementation, an ionic etchant interacts with the second sacrificial oxide layer 1042' and the drift regions 1036' exposed by the source-body contact opening resist layer 1046'. The etching process forms a plurality of source-body contact openings 1048'. Each of the source-body contact openings are disposed within the cells formed by the plurality of trenches 1012'.

At 1050, the exposed portion of the body regions are heavily p-doped to form source-body implant regions 1050'. In one implementation, the doping process implants a p-type impurity 1049', such as boron, in the body regions 1035'. A thermal cycle may be utilized to drive the source-body implant 1050' substantially throughout the exposed portion of the body regions 1035'. It is appreciated that a portion of the source-body implant 1050' will diffuse laterally into the adjacent un-exposed portions of the body regions 1035'.

At 1052, the source-body contact opening resist layer 1046' is removed utilizing an appropriate resist stripper or a resist ashing process. At 1054, a fourth dielectric layer 1054' is formed on the walls of the source-body contact openings 1048'. In one implementation, the dielectric layer 1054' is formed by oxidizing the exposed surface of the silicon to form a silicon dioxide layer.

At 1056, the portion of the dielectric layer 1054' formed at the bottom of the source-body contact openings 1048' and the exposed portion of the body regions 1035' are etched by any well-known anisotropic etching method. The etching process is performed until the source-body contact openings 1056' extend partially into the substrate 1002'. The etching process leaves the adjacent portions of the body regions 1035' and source region 1002' exposed, while the drift regions 1036' remain protected by the dielectric layer 1054'. It is appreciated that the portions of the source-body contact implant that diffused laterally into the un-exposed portion of the body regions 1035' substantially remains after the present etching process. The remaining portions of the source-body contact implant form first source-body contacts 1050'.

At 1058, a first metal layer 1060' is deposited in the bottoms of the source-body contact openings 1056' and reacted with the exposed portions of the body regions 1035' and the substrate 1002'. In one implementation, titanium is sputtered in the openings and rapidly thermal annealed to form titanium silicide (TiSi). The titanium silicide forms second source-body contacts 1060', which in combination with the first source-body contacts 1050', electrically coupled the body regions 1035' to the substrate region 1002'. At 1060, the un-reacted portion of the titanium along the dielectric lined walls of the source-body contact openings is etched away. At 1062, a fifth dielectric layer is deposited in the source-body contact openings to form a source-body insulator region 1064'. In one implementation, the dielectric layer is deposited in the source-body contact openings 1056' utilizing a sub-atmospheric chemical vapor deposition (SACVD) process.

Figure 10D:
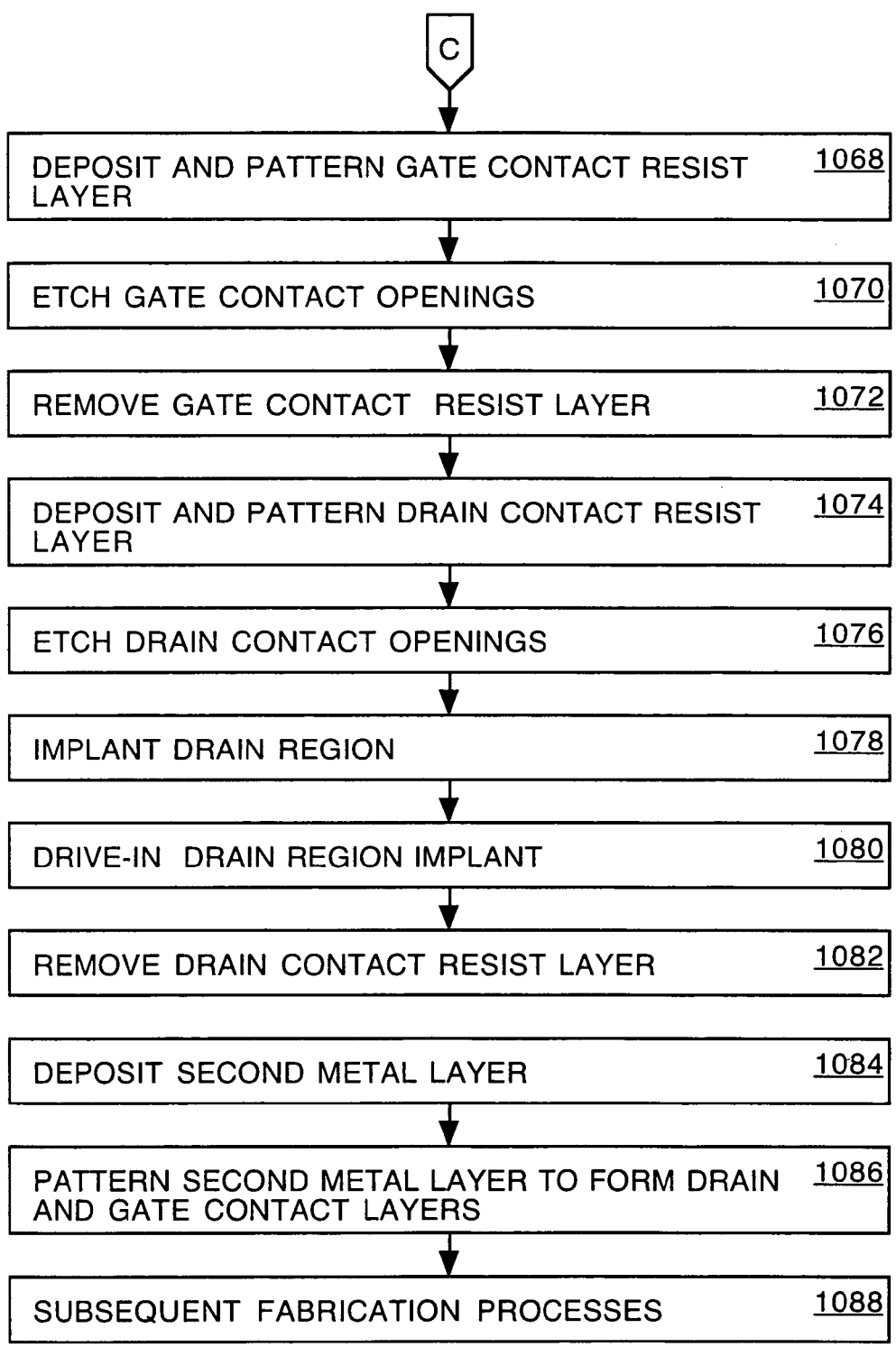

As depicted in FIG. 10D, a photo-resist is deposited and patterned by any well-known lithography process to form a gate contact resist layer (not shown), at 1068. The gate contacts are formed in the periphery (not shown). At 1070, the exposed portion of the fifth dielectric layer and the gate insulator regions 1030' are etched by any well-known anisotropic etching method (not shown). In one implementation, an ionic etchant interacts with the gate oxide exposed by the gate contact resist layer. The gate contact opening extends down to the gate regions 1020'. At 1072, the gate contact resist layer is removed utilizing an appropriate resist stripper or a resist ashing process (not shown).

At 1074, a photo-resist is deposited and patterned by any well-known lithography process to form a drain contact resist layer (not shown). At 1076, the exposed portion of the fifth dielectric layer is etched by any well-known anisotropic etching method. In one implementation, an ionic etchant interacts with the fifth dielectric layer to form drain contact openings. The drain contact openings extend down to the drift regions 1036'. At 1078, the upper portion of the drift region is heavily n-doped to form drain regions. At optional process 1080, a third thermal cycle is utilized to drive (e.g., diffusion) the implanted impurity to achieve the desired depth of the drain regions 1080'. At 1082, the drain contact resist layer is removed utilizing an appropriate resist stripper or a resist ashing process.

At 1084, a second metal layer is deposited on the wafer. In one implementation, the second metal layer, such as aluminum, is deposited by any well-known method such as sputtering. The metal layer covers the tops of the drain, the gate oxide and the source-body contact oxide regions and makes electrical contact with the drain regions. The second metal layer also extends down into the gate contact opening to make an electrical contact to the gate region. The metal layer is then patterned utilizing a photo-resist mask and selective etching method to form a gate contact layer (not shown) and a drain contact layer 1086', at 1086.

At 1088, fabrication continues with various backside processes to form a source contact. The various processes typically include etching, deposition, doping, cleaning, annealing, passivation, cleaving and/or the like.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of fabrication a striped cell trench metal-oxide-semiconductor field effect transistor (TMOSFET) comprising:
    depositing a first semiconductor layer upon a semiconductor substrate, wherein said first semiconductor layer is doped with a first type of impurity and said semiconductor substrate is doped with a second type of impurity;
    depositing a second semiconductor layer upon said first semiconductor layer;
    etching a first plurality of trenches in said first semiconductor layer, said second semiconductor layer and a portion of said semiconductor substrate, wherein said first plurality of trenches are substantially parallel with respect to each other;
    forming a first dielectric layer in said first plurality of trenches;
    depositing a first polysilicon layer in said first plurality of trenches;
    depositing a second dielectric layer in said first plurality of trenches upon said first polysilicon layer;
    doping said first semiconductor layer with said first type of impurity;
    doping a portion of said second semiconductor layer, opposite said first semiconductor layer, with said second type of impurity at a first concentration; and
    etching a second plurality of trenches in said first semiconductor layer said second semiconductor layer and a portion of said semiconductor substrate, wherein said second plurality of trenches are substantially parallel with respect to each other and disposed between said first plurality of trenches;
    doping a portion of said first semiconductor layer proximate said second plurality of trenches;
    forming a silicide along said semiconductor substrate and said first semiconductor layer in said second plurality of trenches; and
    depositing a third dielectric layer in said second plurality of trenches.

2. The method according to claim 1, wherein said depositing said first semiconductor layer comprises epitaxial depositing silicon doped with boron.

3. The method according to claim 1, wherein said depositing said second semiconductor layer comprises epitaxial depositing silicon doped with boron.

4. The method according to claim 3, wherein doping said first semiconductor layer with said first type of impurity comprises implanting boron.

5. The method according to claim 1, wherein said depositing said second semiconductor layer comprises epitaxial depositing silicon doped with phosphorous or arsenic.

6. The method according to claim 1, wherein doping a portion of said second semiconductor layer, opposite said first semiconductor layer, with said second type of impurity comprises implanting phosphorous or arsenic.

7. The method according to claim 1, further comprising doping said second semiconductor layer with said second type of impurity at a second concentration prior to said doping said portion of said second semiconductor layer, wherein said first concentration is greater than said second concentration.

8. The method according to claim 1, wherein forming said silicide comprises:
 sputtering a metal film along said semiconductor substrate and said first semiconductor layer in said second plurality of trenches; and
 thermal cycling said metal film, said semiconductor substrate and said first semiconductor layer.

9. The method according to claim 1, further comprising:
 depositing a second polysilicon layer in said first plurality of trenches between said first polysilicon layer and said second dielectric layer; and
 forming a fourth dielectric layer between said first polysilicon layer and second polysilicon layer.

10. A method of fabrication a closed cell trench metal-oxide-semiconductor field effect transistor (TMOSFET) comprising:
 depositing a first semiconductor layer upon a semiconductor substrate, wherein said first semiconductor layer is doped with a first type of impurity and said semiconductor substrate is doped with a second type of impurity;
 depositing a second semiconductor layer upon said first semiconductor layer;
 etching a plurality of trenches in said first semiconductor layer, said second semiconductor layer and a portion of said semiconductor substrate, wherein a first set of said plurality of trenches are substantially parallel with respect to each other and a second set of said plurality of trenches are substantially normal-to-parallel with respect to the first set of said plurality of trenches;
 forming a first dielectric layer in said first semiconductor layer, said second semiconductor layer and said substrate proximate said plurality of trenches proximate said plurality of trenches;
 depositing a first polysilicon layer in said first plurality of trenches;
 depositing a second dielectric layer in said first plurality of trenches upon said first polysilicon layer;
 doping said first semiconductor layer with said first type of impurity;
 doping said second semiconductor layer with said second type of impurity at a first concentration;
 doping a portion of said second semiconductor layer, opposite said first semiconductor layer, with said second type of impurity at a second concentration;
 etching a plurality of openings in said first semiconductor layer said second semiconductor layer and a portion of said semiconductor substrate, wherein said openings are disposed within each of a plurality of cells formed between said plurality of trenches;
 doping a portion of said first semiconductor layer proximate said plurality of openings;
 forming a silicide along said semiconductor substrate and said first semiconductor layer in said plurality of openings; and
 depositing a third dielectric layer in said plurality of openings.

11. The method according to claim 10, wherein:
 said depositing said first semiconductor layer comprises epitaxial depositing silicon doped with boron; and
 said depositing said second semiconductor layer comprises epitaxial depositing silicon doped with phosphorous or arsenic.

12. The method according to claim 10, wherein doping said second semiconductor layer with said second type of impurity comprises implanting phosphorous or arsenic.

13. The method according to claim 10, wherein doping said first semiconductor layer with said first type of impurity comprises implanting boron.

14. The method according to claim 10, wherein doping a portion of said second semiconductor layer, opposite said first semiconductor layer, with said second type of impurity comprises implanting phosphorous.

15. The method according to claim 10, wherein forming said silicide comprises:
 sputtering a metal film along said semiconductor substrate and said first semiconductor layer in said plurality of openings; and
 thermal cycling said metal film said semiconductor substrate and said first semiconductor layer.

16. The method according to claim 10, further comprising:
 depositing a second polysilicon layer in said first plurality of trenches between said first polysilicon layer and said second dielectric layer; and
 forming a fourth dielectric layer between said first polysilicon layer and second polysilicon layer.

* * * * *